United States Patent
Shah et al.

(10) Patent No.: US 11,911,839 B2
(45) Date of Patent: Feb. 27, 2024

(54) LOW TEMPERATURE HYBRID BONDING

(71) Applicant: ADVANCED MICRO DEVICES, INC., Santa Clara, CA (US)

(72) Inventors: Priyal Shah, Santa Clara, CA (US); Rahul Agarwal, Santa Clara, CA (US); Raja Swaminathan, Austin, TX (US); Brett P. Wilkerson, Austin, TX (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 17/563,830

(22) Filed: Dec. 28, 2021

(65) Prior Publication Data
US 2023/0201952 A1    Jun. 29, 2023

(51) Int. Cl.
*B23K 20/02* (2006.01)
*B23K 20/24* (2006.01)
(Continued)

(52) U.S. Cl.
CPC .............. *B23K 20/02* (2013.01); *B23K 20/24* (2013.01); *H01L 24/05* (2013.01); *H01L 24/08* (2013.01); *H01L 24/80* (2013.01); *B23K 2101/40* (2018.08); *B23K 2103/56* (2018.08); *H01L 25/0657* (2013.01); *H01L 2224/05557* (2013.01); *H01L 2224/05567* (2013.01); *H01L 2224/05572* (2013.01); *H01L 2224/08147* (2013.01); *H01L 2224/08148* (2013.01); *H01L 2224/8003* (2013.01); *H01L 2224/80031* (2013.01); *H01L 2224/80048* (2013.01); *H01L 2224/80051* (2013.01);
(Continued)

(58) Field of Classification Search
CPC ......... H01L 24/05; H01L 24/08; H01L 24/80; H01L 2224/05557; H01L 2224/05572; H01L 2224/08147; H01L 2224/08148; H01L 25/0657
See application file for complete search history.

(56) References Cited

U.S. PATENT DOCUMENTS

| | | | |
|---|---|---|---|
| 11,348,901 B1 * | 5/2022 | Hou | H01L 24/32 |
| 11,450,637 B2 * | 9/2022 | Wang | H10B 41/50 |

(Continued)

OTHER PUBLICATIONS

Chiu et al., Nanotwinned Copper Hybrid Bonding and Wafer-On-Wafer Integration, 2020 IEEE 70th Electronic Components and Technology Conference (ECTC), Jun. 3-30, 2020, pp. 210-215, IEEE, Orlando, FL, USA, DOI: 10.1109/ECTC32862.2020.00045, published Jun. 1, 2020, 6 pages.

(Continued)

*Primary Examiner* — Mamadou L Diallo

(57) ABSTRACT

A semiconductor device includes a first die, the first die including a first dielectric layer and a plurality of first bond pads formed within apertures in the first dielectric layer, and a second die bonded to the first die, the second die including a second dielectric layer and a plurality of second bond pads protruding from the second dielectric layer. The first die is bonded to the second die such that the plurality of second bond pads protrude into the apertures in the first dielectric layer to establish respective metallurgical bonds with the plurality of first bond pads. A reduction in the distance between the respective bond pads of the dies results in a lower temperature for establishing a hybrid bond.

20 Claims, 21 Drawing Sheets

(51) Int. Cl.
H01L 23/00 (2006.01)
H01L 25/065 (2023.01)
*B23K 103/00* (2006.01)
*B23K 101/40* (2006.01)

(52) U.S. Cl.
CPC ............. *H01L 2224/80097* (2013.01); *H01L 2224/80203* (2013.01); *H01L 2224/80345* (2013.01); *H01L 2224/80895* (2013.01); *H01L 2224/80896* (2013.01)

(56) References Cited

U.S. PATENT DOCUMENTS

| | | | |
|---|---|---|---|
| 2020/0194396 A1* | 6/2020 | Uzoh | H01L 25/0657 |
| 2022/0367415 A1* | 11/2022 | Huang | H01L 25/0657 |
| 2023/0011840 A1* | 1/2023 | Chang | H01L 21/76898 |
| 2023/0050652 A1* | 2/2023 | Moon | H01L 24/03 |
| 2023/0060671 A1* | 3/2023 | Hsu | H10N 10/17 |
| 2023/0063954 A1* | 3/2023 | Zhou | H01L 24/80 |
| 2023/0064032 A1* | 3/2023 | Kirby | H01L 24/08 |
| 2023/0138813 A1* | 5/2023 | Seo | H01L 24/08 257/774 |
| 2023/0141447 A1* | 5/2023 | Lee | H01L 24/08 257/782 |

OTHER PUBLICATIONS

Liu, et. al., Low-temperature direct copper-to-copper bonding enabled by creep on (111) surfaces of nanotwinned Cu, Scientific Reports, May 2015, vol. 5.

* cited by examiner

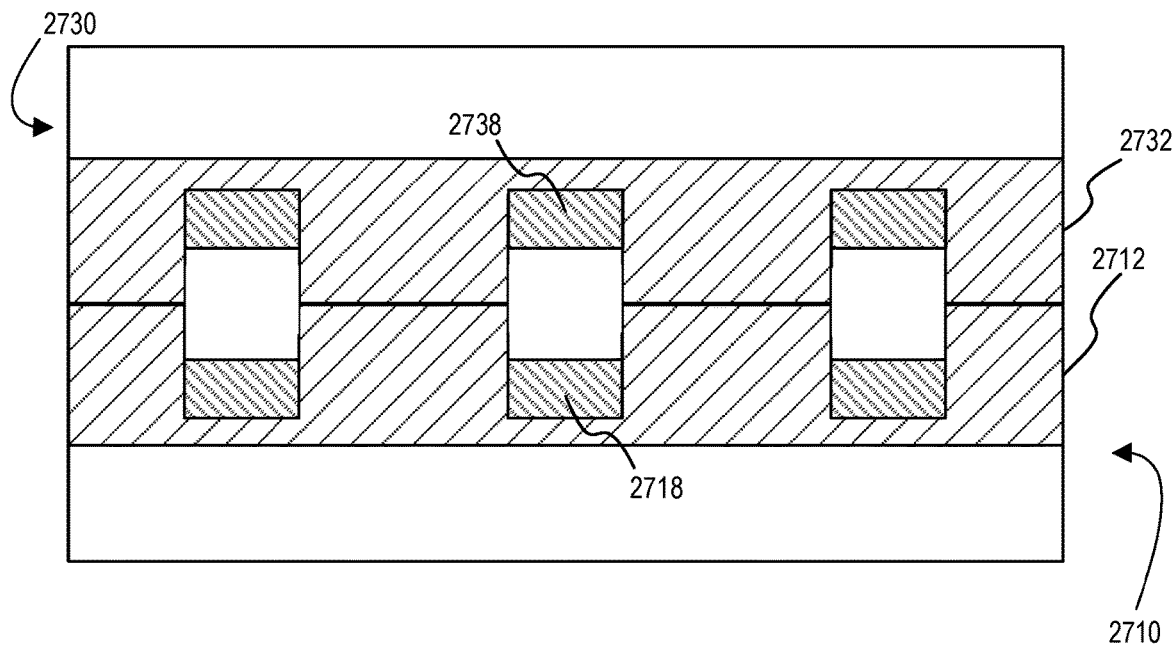
FIG. 27
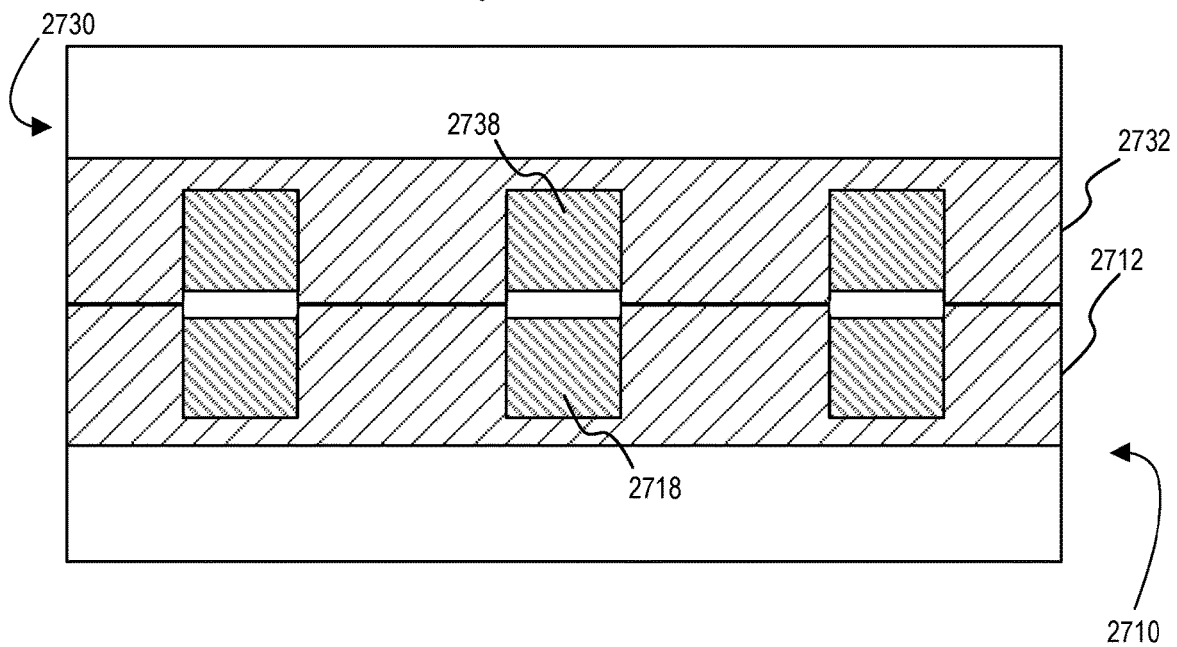
FIG. 28

```
┌─────────────────────────────────────────────────────────────┐
│ Provide A First Die That Includes A First Dielectric Layer  │
│            And A Plurality Of First Bond Pads 3002          │
└─────────────────────────────────────────────────────────────┘
                              │
                              ▼
┌─────────────────────────────────────────────────────────────┐
│ Provide A Second Die That Includes A Second Dielectric Layer│
│ And A Plurality Of Second Bond Pads, Wherein The Plurality  │
│ Of Second Bond Pads That Protrude From A Surface Of The     │
│               Second Dielectric Layer 3004                  │
└─────────────────────────────────────────────────────────────┘
                              │
                              ▼
┌─────────────────────────────────────────────────────────────┐
│ Bond The First Die And The And The Second Die Such That A   │
│ Dielectric Bond Between The First Dielectric Layer Is       │
│ Established In A First Temperature Range And A Metallurgical│
│ Bond Between The Plurality Of First Bond Pads And The       │
│ Plurality Of Second Bond Pads Is Established In A Second    │
│                   Temperature Range 3006                    │
│ ┌─────────────────────────────────────────────────────────┐ │
│ │ Establish The Metallurgical Bond In A First Plane And   │ │
│ │ Establishing The Dielectric Bond In A Second Plane,     │ │
│ │ Wherein The First Plane Is Offset From The Second Plane │ │
│ │ In A Direction Perpendicular To The Dielectric Bond     │ │
│ │                    Interface 3102                       │ │
│ └─────────────────────────────────────────────────────────┘ │
└─────────────────────────────────────────────────────────────┘
```

FIG. 31

LOW TEMPERATURE HYBRID BONDING

BACKGROUND

Hybrid bonding enables solder-free interconnection of two or more dies or two or more wafers through a dielectric (e.g., oxide-oxide) bond that provides compression during the establishment of a metallurgical bond (i.e., metal-metal) between bond pads of the dies. Hybrid bonds provide superior electrical, mechanical, and thermal performance compared to micro-bumps or other solder technologies. However, conventional hybrid bonding techniques can require an annealing process in excess of 400° C. for 1-2 hours to establish the metal-metal diffusion bond. The thermal budget of such a process is not suitable for temperature sensitive applications, such as high bandwidth memory (HBM) die stacking, advanced silicon nodes, and so on. As such, there is a need to develop a low temperature hybrid bonding process to bond dies with reduced thermal budget.

BRIEF DESCRIPTION OF THE DRAWINGS

FIG. 27 is a portion of an eighth example process flow for low temperature hybrid bonding according to some implementations.

FIG. 28 is another portion of the eighth example process flow for low temperature hybrid bonding according to some implementations.

FIG. 31 is a flowchart of an example method of low temperature hybrid bonding according to some implementations.

DETAILED DESCRIPTION

Figure 1:
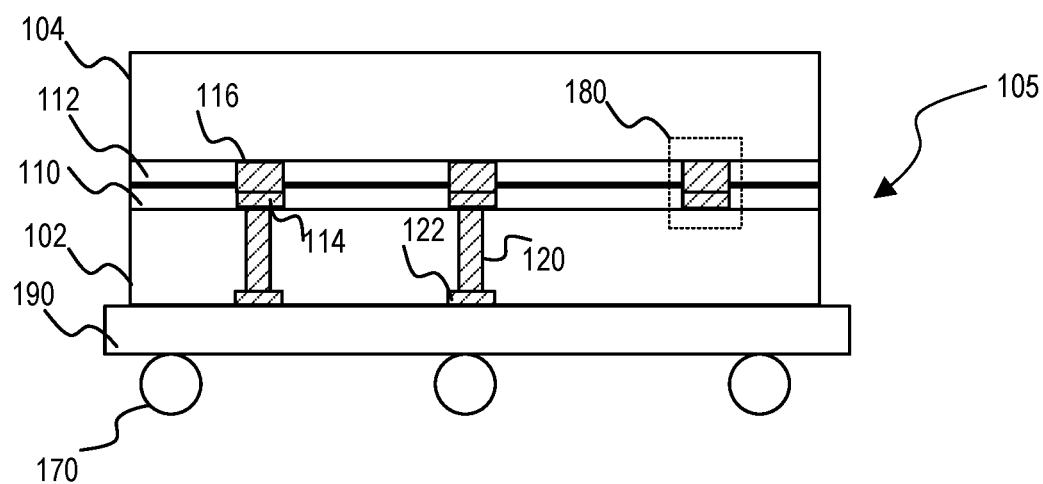
FIG. 1 sets forth a cross section block diagram of an example apparatus for low temperature hybrid bonding in accordance with some implementations of the present disclosure.

To further reduce the temperature at which a hybrid bond can be established between two components, some implementations in accordance with the present disclosure include a die with bond pads that protrude from a dielectric layer and that project into bond pad recesses in the dielectric layer of a mated die, thus reducing the amount of thermal expansion necessary to bring the bond pads of the mated dies into contact. That is, the distance between the bond pads is reduced at the outset of the bonding process. The reduction in the amount of initial thermal expansion reduces the overall process temperature needed to establish a hybrid bond. The resulting metallurgical bond interfaces are unaligned with the dielectric bond interface.

An implementation is directed to a semiconductor device for low temperature hybrid bonding in accordance with the present disclosure. The semiconductor device includes a first die having a first dielectric layer a plurality of first bond pads formed within apertures in the first dielectric layer. The semiconductor device also includes a second die bonded to the first die, the second die including a second dielectric layer and a plurality of second bond pads protruding from the second dielectric layer. The first die is bonded to the second die such that the plurality of second bond pads protrude into the apertures in the first dielectric layer to establish respective metallurgical bonds with the plurality of first bond pads.

In some implementations, a hybrid bond of the first die and the second die includes the metallurgical bonds between the plurality of first bond pads and the plurality of second bond pads and a dielectric bond between the first dielectric layer and the second dielectric layer. In some examples, an interface of at least one metallurgical bond is unaligned with an interface of the dielectric bond.

In some implementations, each of the plurality of first bond pads includes a notch and the plurality of second bond pads mate with the notches of the plurality of first bond pads. In some examples, the metallurgical bond is a cold weld.

In some implementations, prior to bonding, a first distance between the plurality of first bond pads and a surface of the first dielectric layer is greater than a second distance by which the plurality of second bond pads protrude from the second dielectric layer. In some examples, a difference between the first distance and the second distance is 1-2 nanometers.

A variation of the implementation is directed to an apparatus that includes a carrier having a plurality of interconnects for mounting to a component and a first die coupled to the carrier. The first die includes a first dielectric layer and a plurality of first bond pads formed within apertures in the first dielectric layer. The apparatus also includes a second die bonded to the first die, the second die including a second dielectric layer and a plurality of second bond pads protruding from the second dielectric layer. The first die is bonded to the second die such that the plurality of second bond pads protrude into the apertures in the first dielectric layer to establish respective metallurgical bonds with the plurality of first bond pads.

In some implementations, a hybrid bond of the first die and the second die includes the metallurgical bonds between the plurality of first bond pads and the plurality of second bond pads and a dielectric bond between the first dielectric layer and the second dielectric layer. In some examples, an interface of at least one metallurgical bond is unaligned with an interface of the dielectric bond.

In some implementations, each of the plurality of first bond pads includes a notch and the plurality of second bond pads mate with the notches of the plurality of first bond pads. In some examples, the metallurgical bond is a cold weld.

In some implementations, prior to bonding, a first distance between the plurality of first bond pads and a surface of the first dielectric layer is greater than a second distance by which the plurality of second bond pads protrude from the second dielectric layer.

Another variation of the implementation is directed to a method of low temperature hybrid bonding. The method includes providing a first die that includes a first dielectric layer and a plurality of first bond pads. The method also includes providing a second die that includes a second dielectric layer and a plurality of second bond pads, where the plurality of second bond pads that protrude from a surface of the second dielectric layer. The method further includes bonding the first die and the second die such that a dielectric bond between the first dielectric layer is established in a first temperature range and a metallurgical bond between the plurality of first bond pads and the plurality of second bond pads is established in a second temperature range.

In some implementations, a thermal expansion of the plurality of first bond pads and the plurality of second bond pads causes the plurality of first bond pads and the plurality of second bond pads to make contact within the first temperature range.

In some implementations, the plurality of first bond pads of the first die is at least partially recessed from a surface of the first dielectric layer. In some examples, bonding the first die and the second die includes establishing the metallurgical bond in a first plane and establishing the dielectric bond in a second plane, where the first plane is offset from the second plane in a direction perpendicular to the dielectric bond interface. In some examples, the plurality of first bond pads include a notch for receiving the plurality of second bond pads that are protruded from the second die.

In some implementations, the method also includes plating an annular portion of each of the plurality of first bond pads on a respective base portion of the first bond pads, where an aperture formed by the annular portion provides the notch for receiving a protruded bond pad. In some implementations, the method also includes etching the second dielectric layer such that the plurality of second bond pads protrude from the second dielectric layer.

In some implementations, where plurality of first bond pads protrude from a surface of the first dielectric layer, the method also includes cooling the first die and the second die to a subzero temperature prior to bonding.

Implementations in accordance with the present disclosure will be described in further detail beginning with FIG. 1. Like reference numerals refer to like elements throughout the specification and drawings. While the drawings exhibit a particular number components, such as dies, bond pads, and so on, the numbers of such components in the drawings is selected to simplify explanation and should not be construed as limiting. FIG. 1 sets forth a block diagram of an example semiconductor apparatus 100 in accordance with some implementations of the present disclosure. Implementations of the semiconductor apparatus 100 can be useful in high performance applications, such as, for example, a personal computer, a notebook, a tablet, a smart phone, a storage data center, or applications involving large scale databases and/or analytics, such as finance, life sciences, and/or artificial intelligence. Many other applications are possible.

FIG. 1 depicts a sectional view of the example semiconductor apparatus 100 that includes a semiconductor device 105 including a first die 102 bonded to a second die 104. In the example of FIG. 1, the dies 102, 104 are shown in a face-to-face arrangement, however it should be recognized that the dies 102, 104 can be bonded in a face-to-back arrangement. Each die 102, 104 includes a respective dielectric layer 110, 112 having embedded therein respective sets of bond pads 114, 116. Bond pads 114 can be electrically coupled via an interconnect layer (not shown) of the first die 102 to various logic blocks (not shown) of the die 102, and bond pads 116 can be electrically coupled via an interconnect layer (not shown) of the second die 104 to various logic blocks (not shown) of the die 104. The bond between the dies 102, 104 is a hybrid bond that is formed by a dielectric bond between the dielectric layers 110, 112 and a metallurgical bond between the respective sets of bond pads 114, 116. The hybrid bond provides fine-pitched high-density interconnects between the logic blocks of the dies 102, 104. In some examples, the semiconductor device 105 including the dies 102, 104 is mounted on a carrier 190, such as a substrate or interposer, that includes interconnects 170 for mounting on another component such as a printed circuit board. In some implementations, the first die 102 includes through-silicon vias 120 that connect another set of bond pads 122 coupled to the carrier to the bond pads 114 for receiving power and ground and for conveying input/output signals through the carrier and the interconnects 170 to external components. In some examples, the bond pads 114, 116 are composed of copper, aluminum, gold, platinum, nickel, palladium, combinations of such, or other conductors. In some implementations, the bond pads 114, 116 can be composed of highly (111)-oriented nanotwinned copper. In some implementations, the dielectric layers 110, 112 are composed of silicon dioxide or other suitable insulators.

In some implementations, the interface of the metallurgical bond between the bond pads 114, 116 is not aligned with the interface between the dielectric layers 110, 112 that establishes the dielectric bond. For example, the bond pads 116 of die 104 can protrude into recesses of the dielectric layer 112 that seat the bond pads 114 of die 102. When the metallurgical bond is established, the interfaces between the bond pads are disposed within these recesses. The dashed box 180 is shown in greater magnification in FIG. 2.

Figure 2:
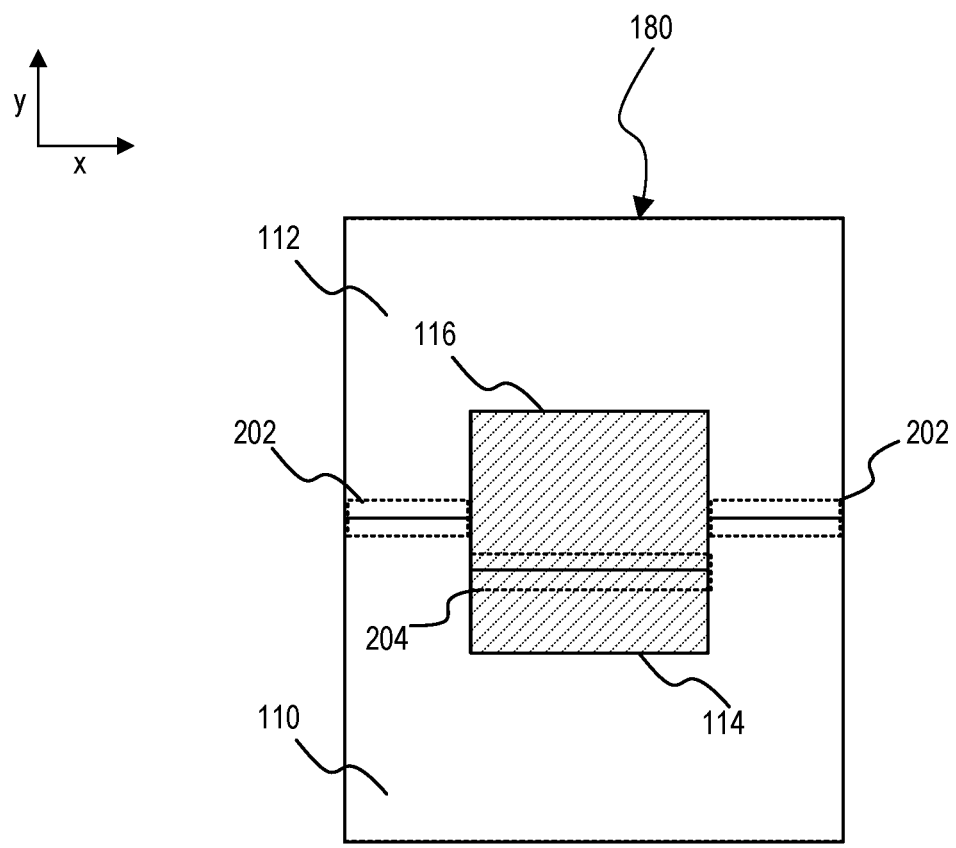
FIG. 2 sets forth a detailed view of the example in FIG. 1.

FIG. 2 shows the hybrid bond 180 described in FIG. 1 in greater magnification. In FIG. 2, dielectric bond interface 202 is an area where the dielectric layer 110 of die 102 forms a dielectric bond with the dielectric layer 112 of die 104. The metal bond interface 204 is an area where the bond pads 114 of die 102 form a metallurgical diffusion bond with the bond pads 116 of die 104. It can be seen that the dielectric bond interface 202 and the metal bond interface 204 are offset along a y-axis. In other words, a plane of the dielectric bond interface 202 and a plane of the metal bond interfaces 204 are offset such that the metal bond interfaces 204 are not aligned with the dielectric bond interfaces. In some implementations, the protrusion of the bond pads 116 into recesses of the dielectric layer 110 that seat the bond pads 114 reduces the amount of thermal expansion needed by the bond pads 114, 116 to initiate diffusion bonding, thus lowering the temperature needed to establish the hybrid bond.

Figure 3:
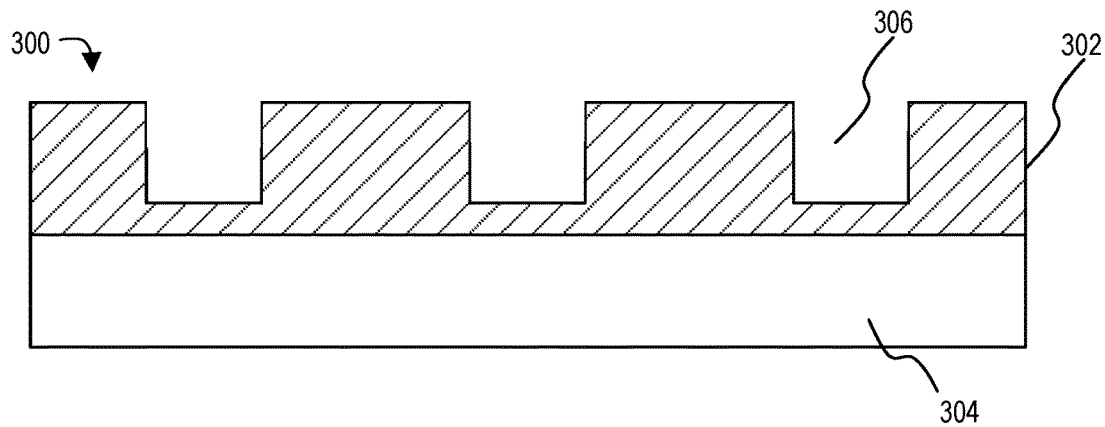
FIG. 3 is a portion of a first example process flow for low temperature hybrid bonding according to some implementations.
Figure 4:
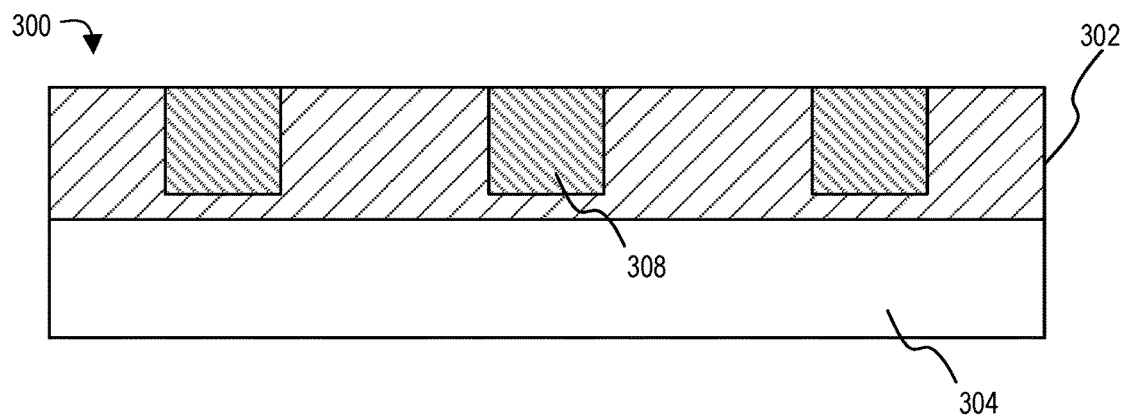
FIG. 4 is another portion of the first example process flow for low temperature hybrid bonding according to some implementations.
Figure 5:
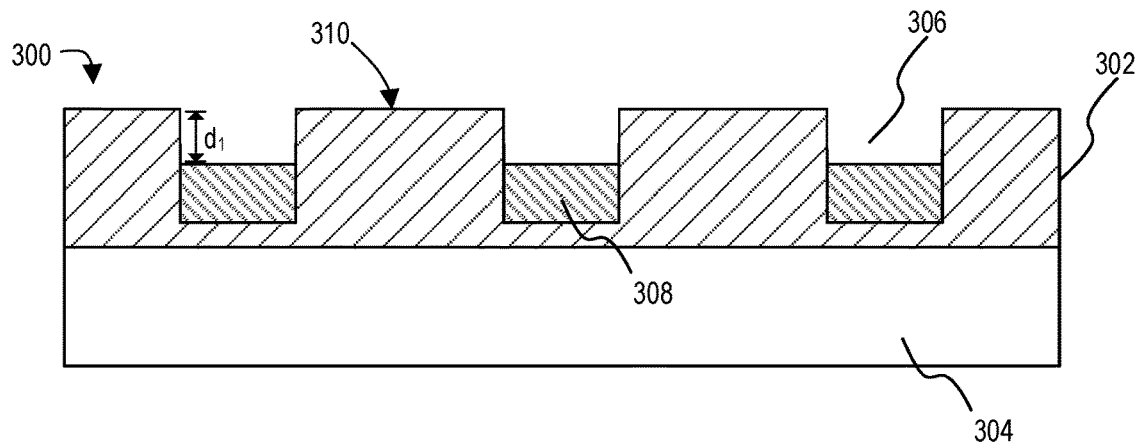
FIG. 5 is another portion of the first example process flow for low temperature hybrid bonding according to some implementations.
Figure 6:
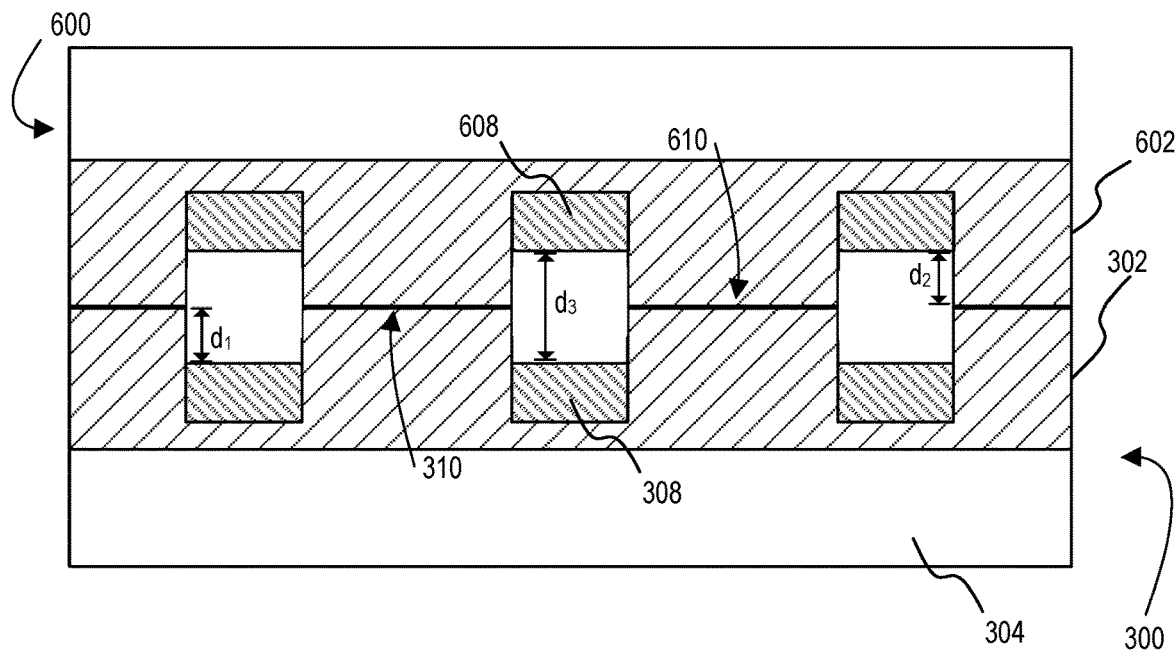
FIG. 6 is another portion of an example process flow for hybrid bonding.

For further explanation, FIGS. 3-5 set forth an example process flow for preparing a die 300 for hybrid bonding, such as the bottom die 102 depicted in FIG. 1, according to various implementations of the present disclosure. Beginning with FIG. 3, a dielectric layer 302 is deposited on a die body 304. In some implementations, the dielectric layer 302 can be composed of silicon dioxide ($SO_2$) or other suitable insulating materials that will be recognized by those of skill in the art. The dielectric layer 302 can be deposited using well-known deposition techniques. In some implementations, the die body 304 includes additional metal and dielectric layers that form an interconnect layer of the die 300, as well as functional logic blocks composed of transistors and other circuitry. After forming the dielectric layer 302, openings 306 are created in the dielectric layer 302. In some implementations, the openings 306 are created through well known masking and etching techniques.

Moving to FIG. 4, bond pads 308 are formed in the openings 306 depicted in FIG. 4. In some implementations, the bond pads 308 are composed of copper or other conductive metals mention above. The bond pads 308 can be formed using well-known masking, plating, chemical vapor deposition (CVD), physical vapor deposition (PVD), or combinations of these techniques. In some examples, prior to forming the bond pads 308, a barrier layer is formed in the openings 306 shown in FIG. 3. The barrier layer can be composed of $Ta_2O_5$, TaN, TiN, or other types of barrier layer materials suitable to prevent copper or other metals from diffusing out through the sidewalls of the opening 306 shown in FIG. 3. Next, in circumstances where copper is used, a copper seed layer can be deposited in the opening 306 and on the barrier layer, for example, by electroless plating. Then, a bulk plating process can be used to establish the bond pads 308.

Moving to FIG. 5, the surface of the die 300 that includes the surfaces of the dielectric layer 302 and the bond pads 308 die is planarized, for example, through a chemical mechanical polishing (CMP) process. In some cases, a typical CMP polish pad is rubbery and tends to push down into and scour the softer bond pads 308 more readily than the relatively harder dielectric layer 302. As a result of the CMP process, in some examples the surfaces of the bond pads 308 recede from the bonding surface 310 of the dielectric layer 302. This result is sometimes referred to as dishing. As a consequence, a distance $d_1$ is created between the surface of the bond pads 308 and the bonding surface 310 of the dielectric layer 302. The distance $d_1$ can be, for example, on the order of 3-6 nanometers. Next, the bonding surface 310 of the dielectric layer 302 is then plasma treated to render it hydrophilic.

For further explanation, FIGS. 6-9 set forth an example process flow for establishing a hybrid bond between the die 300 of FIGS. 3-5 and another die 600. In some implementations, the die 600 is formed through the same process described in FIGS. 3-5, which creates a distance $d_2$ between a surface of bond pads 608 and a bonding surface 610 of a dielectric layer 602. In some examples, $d_2$ is substantially equal to $d_1$. Beginning with FIG. 6, die 600 is placed on die 300 such that the bond pads 608 of die 600 are in alignment with the bond pads 308 of die 300 and a hydrophilic bond is established between the surfaces 310, 610 of the dielectric layers 302, 602 of the dies 300, 600. Here, a distance $d_3$ between the bond pads 308 and the bond pads 608 is $d_3=d_1+d_2$.

Figure 7:
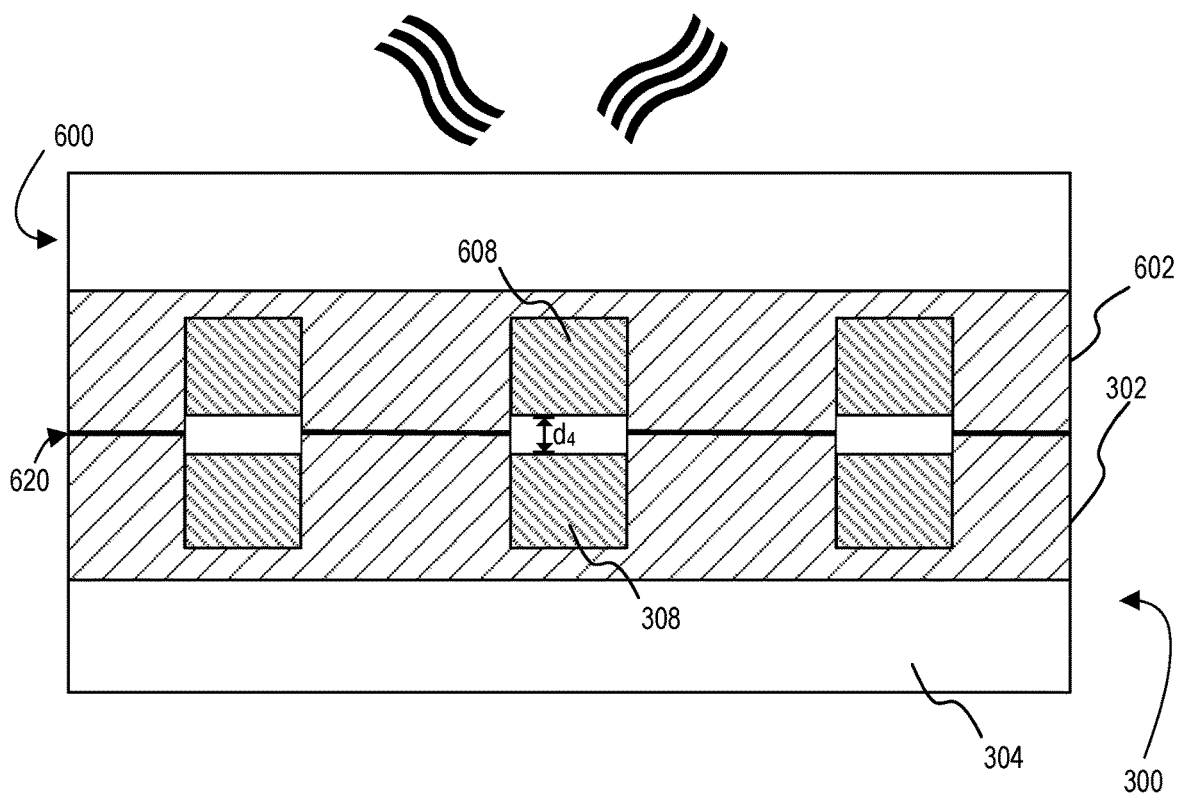
FIG. 7 is another portion of the example process flow for hybrid bonding.

Moving to FIG. 7, a dielectric bond 620 is formed at an interface of the dielectric layer 302 and the dielectric layer 602 during a first anneal process. For example, the first anneal process can be carried out in a temperature range of approximately 100° C. to 150° C. During the first anneal process, the bond pads 308, 608 undergo thermal expansion along the y-axis while being constrained along the x-axis by the dielectric bond between the dielectric layers 302, 602. Further, the barrier layers between the bond pads 308, 608 and the dielectric layers 302, 602 prevents diffusion of the metal into the dielectric material. As a result of this expansion, the distance between the bond pads 308, 608 narrows to a distance $d_4$, where $d_4$ is on the order of 1-2 nanometers. By the end of the first anneal process, the bond pads 308, 608 have not come into contact and thus no bonding between the bond pads 308, 608 has been initiated.

Figure 8:
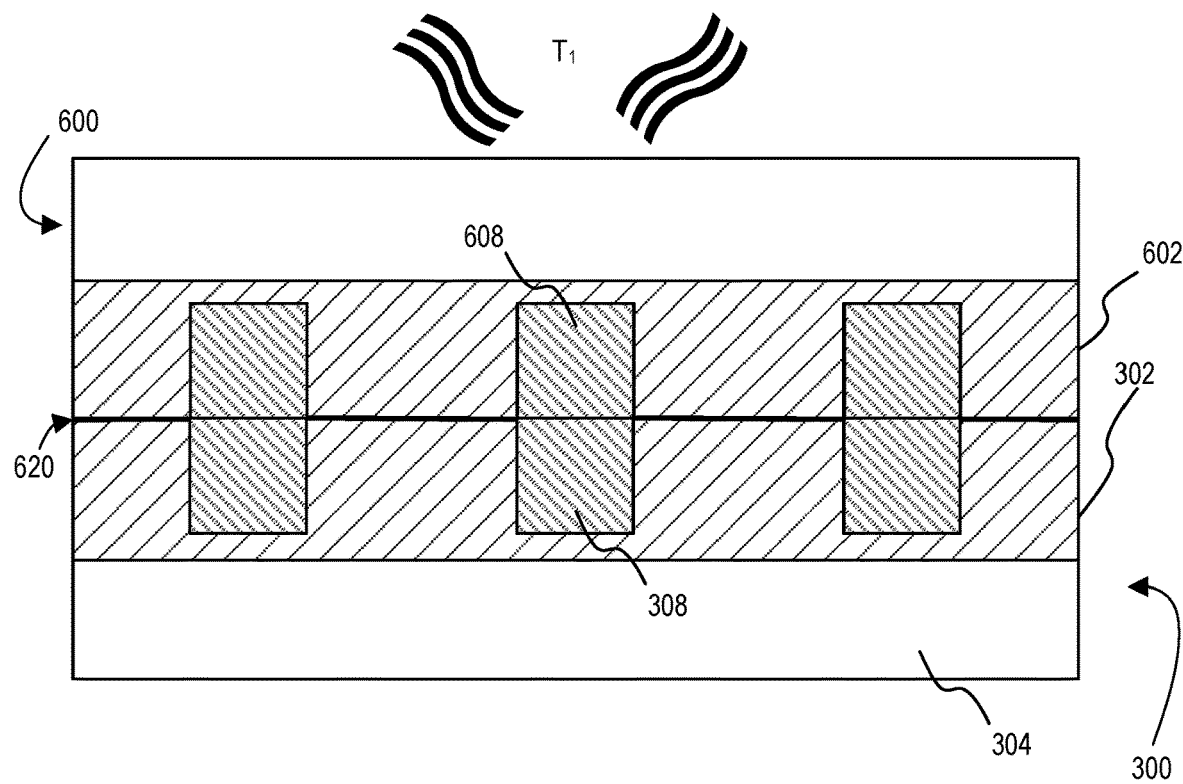
FIG. 8 is another portion of the example process flow for hybrid bonding.

Moving to FIG. 8, after the first anneal process the process temperature is increased to a temperature range $T_1$ during a second anneal process in which the bond pads 308, 608 continue to expand along the y-axis. As a result of this thermal expansion, the gap between the bond pads 308, 608 closes and the bond pads 308, 608 come into contact with one another. Within the temperature range $T_1$, a diffusion bond between the bond pads 308 and the bond pads 608 is initiated.

Figure 9:
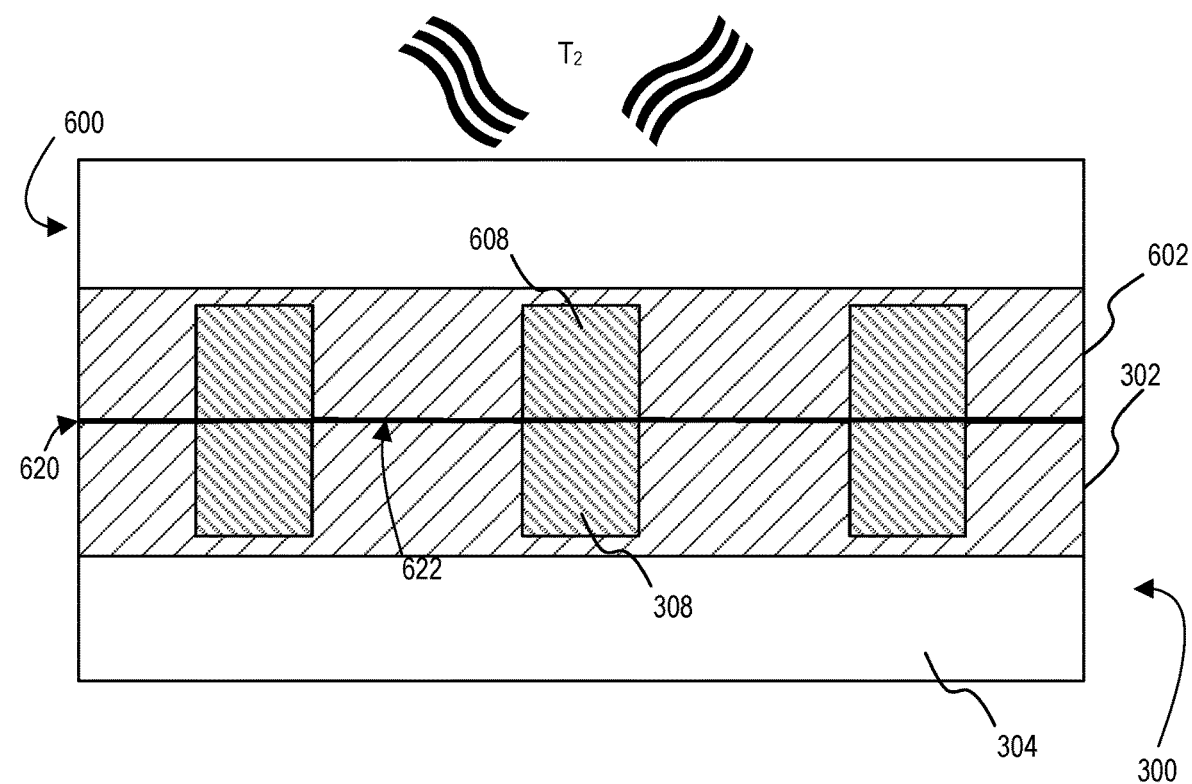
FIG. 9 is another portion of the example process flow for hybrid bonding.

Moving to FIG. 9, during the second anneal process the temperature continues to increase to a second temperature range $T_2$. It should be observed that the temperature range $T_2$ is substantially higher than and not overlapping with the temperature range $T_1$. Within the second temperature range $T_2$, the bond pads 308, 608 undergo plastic deformation and diffusion bonding, which results in a substantially continuous interface 622 between the bond pads 308, 608 that facilitates good electrical conductivity there between. The diffusion bond between the bond pads 308, 608 is substantially coplanar with the dielectric bond between the dielectric layers 302, 602 due to the substantially equal distances d1 and d2 between the recessed bond pads 308, 608 and the respective bonding surfaces 310, 610 of the dielectric layers 302, 602. That is, the thermal expansion of the bond pads 308, 608 along the y-axis causes the bond pads 308, 608 to expand at substantially the same rate for substantially the same distance, such that bond pads 308, 608 meet when the expand to the interface of the dielectric.

It is desirable for the bonding temperature (i.e., $T_2$ in the above example) to be as low as possible while still providing adequate post anneal bonding and spatial relationships between the bond pads 308, 608. This follows from the fact that the higher the bonding temperature is, the more chance there is for structures of the dies 300, 600 or other components to be damaged, which can lead to less than desirable post fabrication electrical performance.

Figure 10:
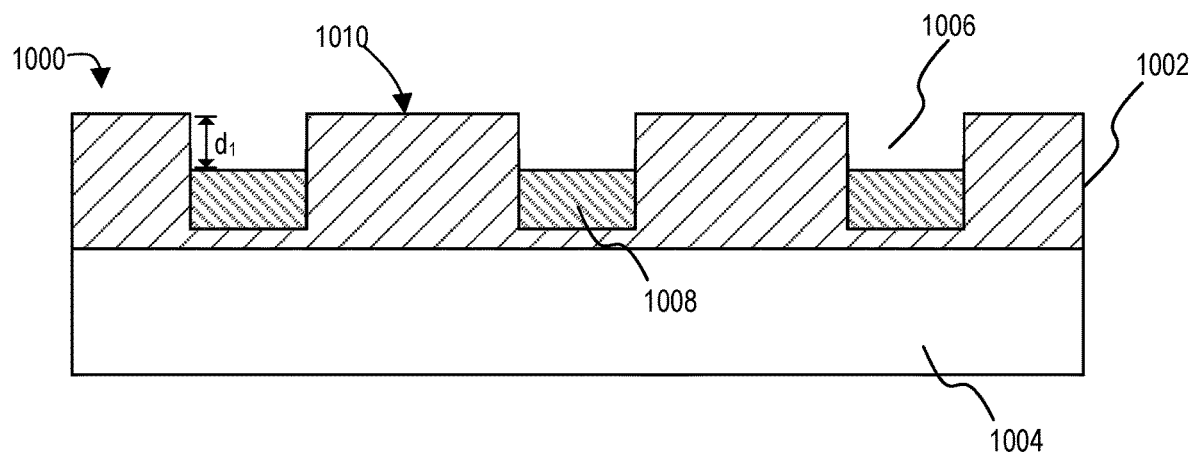
FIG. 10 is portion of a second example process flow for low temperature hybrid bonding according to some implementations.
Figure 11:
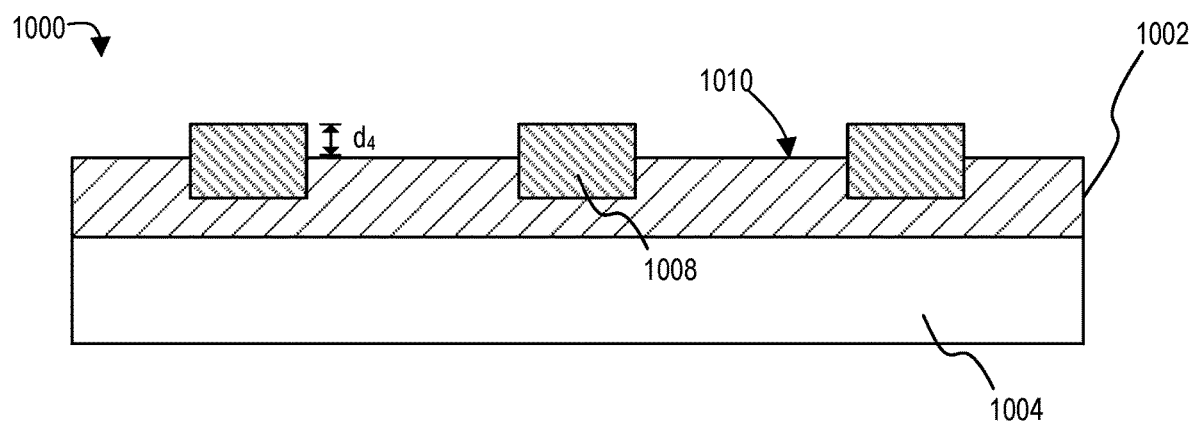
FIG. 11 is another portion of the second example process flow for low temperature hybrid bonding according to some implementations.

For further explanation, FIGS. 10-11 set forth an example process flow for preparing a die 1000 for hybrid bonding, such as the top 104 depicted in FIG. 1, according to various implementations of the present disclosure. Beginning with FIG. 10, die 1000 is prepared as described above with respect to die 300 in FIGS. 3-5. That is, bond pads 1008 are formed in openings 1006 of a dielectric layer 1002 deposited on a die body 1004, and the surface of the die 1000 is planarized in a CMP process that results in the bond pads 1008 being at least partially recessed from a bonding surface 1010 of the dielectric layer by a distance $d_1$.

Moving to FIG. 11, the dielectric layer 1002 is selectively etched using well-known techniques such that the bond pads 1008 protrude from the bonding surface 1010 of the dielectric layer by a distance of $d_4$, where distance $d_4$ is smaller than distance $d_1$. For example, distance $d_4$ can be 1-2 nanometers smaller than $d_1$. The bonding surface 1010 of the dielectric layer is then plasma treated to render it hydrophillic.

Figure 12:
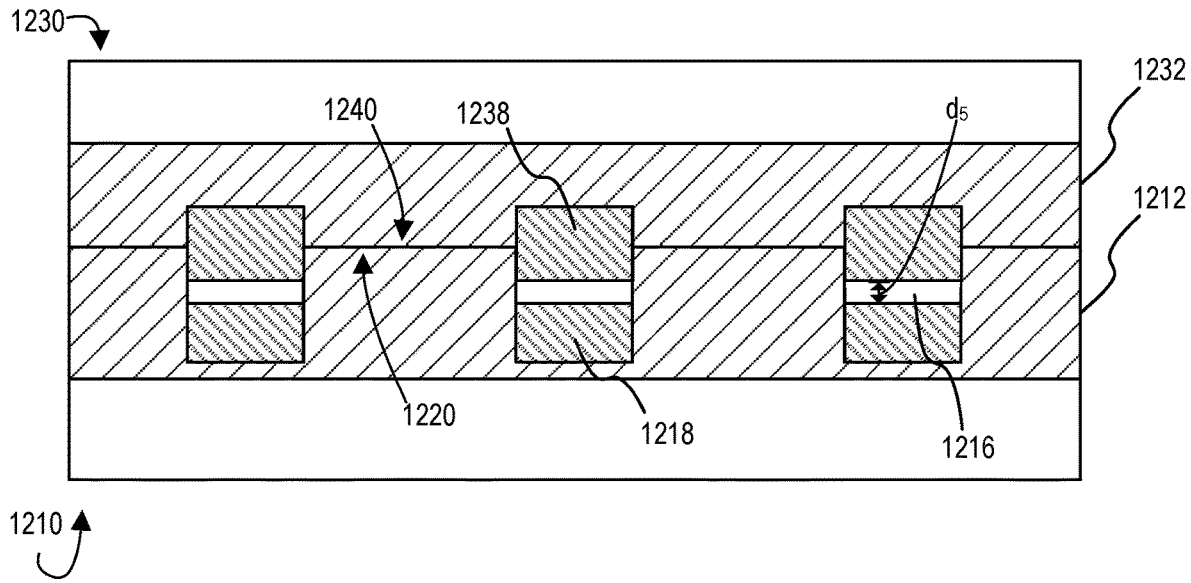
FIG. 12 is a portion of a third example process flow for low temperature hybrid bonding according to some implementations.
Figure 13:
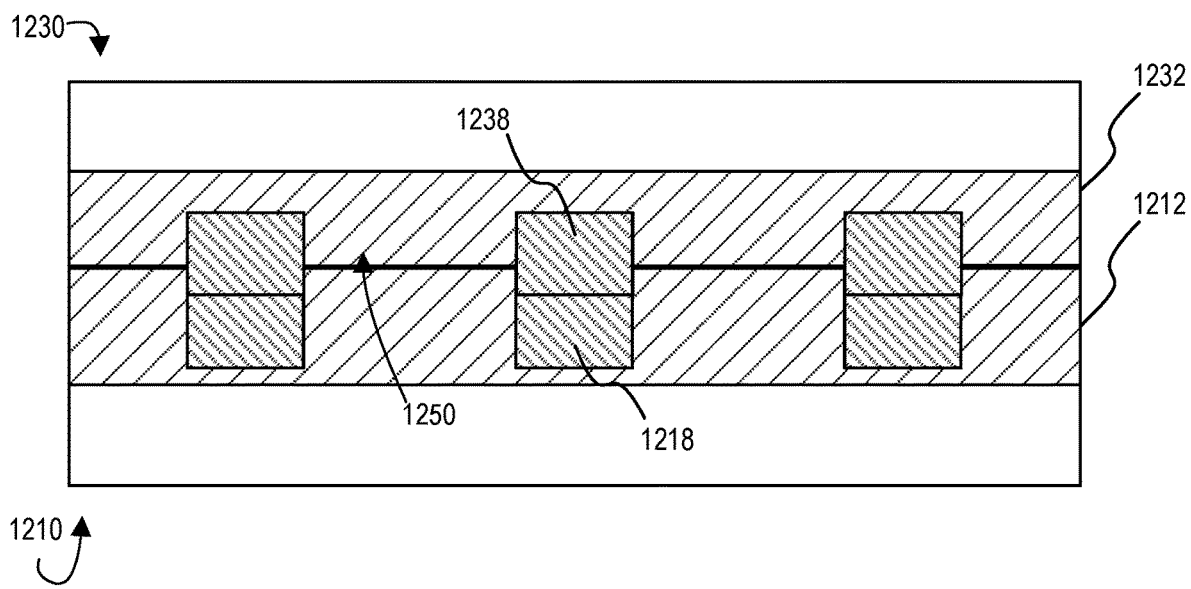
FIG. 13 is another portion of the third example process flow for low temperature hybrid bonding according to some implementations.
Figure 14:
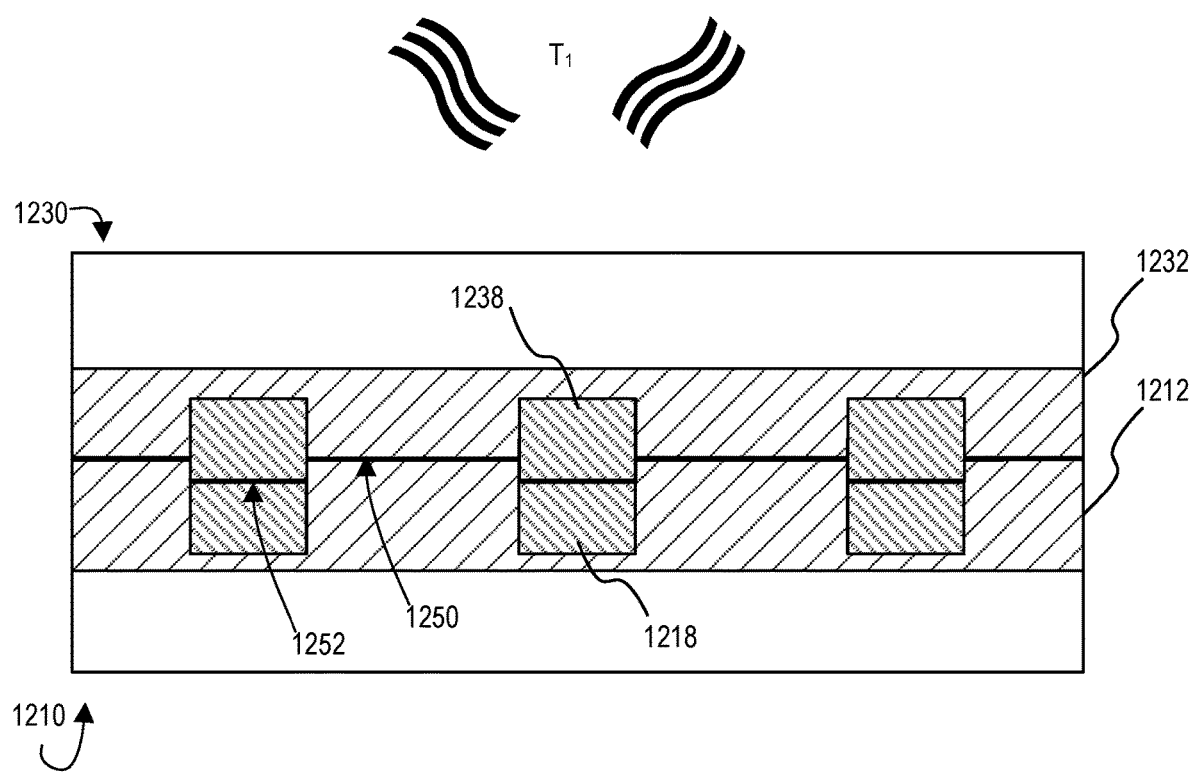
FIG. 14 is another portion of the third process flow for low temperature hybrid bonding according to some implementations.

For further explanation, FIGS. 12-14 set forth an example process flow for a hybrid bonding of a die 1210 with recessed bond pads 1218 and a die 1230 with protruded bond pads 1238. In some implementations, die 1210 is prepared as described with reference to FIGS. 3-5. In some implementations, die 1230 is prepared as described with reference to FIGS. 3-5 and with the additional preparation described with reference to FIGS. 10-11. Beginning with FIG. 12, die 1230 is placed on die 1210 such that the bond pads 1238 of die 1230 are in alignment with the bond pads 1218 of die 1210 and bond pads 1238 of die 1230 protrude into the openings 1216 in the dielectric layer 1212 of die 1210. Next, a hydrophilic bond is established between surfaces 1220, 1240 of dielectric layers 1212, 1232 of the dies 1210, 1230. Here, a distance $d_5$ between the bond pads 1218 and the bond pads 1238 is $d_5=d_1-d_4$. For example, $d_5$ can be on the order of 1-2 nanometers.

Moving to FIG. 13, a dielectric bond 1250 is formed between the dielectric layer 1212 and the dielectric layer 1232 during a first anneal process. For example, the first anneal process can be carried out in a temperature range of approximately 100° C. to 150° C. During the first anneal process, the bond pads 1218, 1238 undergo thermal expansion along the y-axis while being constrained along the x-axis by the dielectric bond between the dielectric layers 1212, 1232. As a result of this expansion, the gap between the bond pads 1218, 1238 closes and the bond pads 1218, 1238 come into contact with one another. Here, a diffusion bond between the bond pads 1218 and the bond pads 1238 is initiated. That is, the diffusion bond between the bond pads 1218, 1238 is initiated during same process step and at the same temperature range as the formation of the dielectric bond 1250.

Moving to FIG. 14, during a second anneal process the temperature continues to increase to a second temperature range $T_1$, where T1 is less than 400° C. Within the temperature range $T_1$, the bond pads 1218, 1238 undergo plastic deformation and diffusion bonding, which results in a metal-metal diffusion bond interface 1252 between the bond pads 1218, 1238 that facilitates good electrical conductivity there between. The plane of the metal-metal diffusion bond interface 1252 between the bond pads 1218, 1238 is substantially offset from a plane of the dielectric bond 1250 between the dielectric layers 1212, 1232 due to the protrusion of the bond pads 1238 into the openings in the dielectric layer 1212 in which the bond pads 1218 are formed. That is, the smaller distance $d_5$ compared to the larger distance $d_3$ requires less thermal expansion of the bond pads 1218, 1238 to establish an interface, and thus the diffusion bond can be established at a lower temperature when compared to the process described above with reference to FIGS. 6-9.

Figure 15:
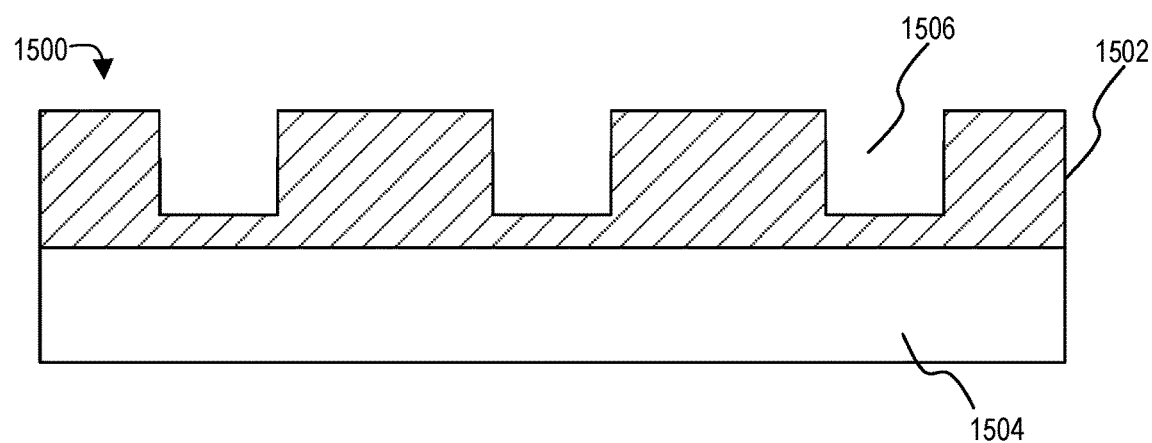
FIG. 15 is a portion of a fourth example process flow for low temperature hybrid bonding according to some implementations.
Figure 16:
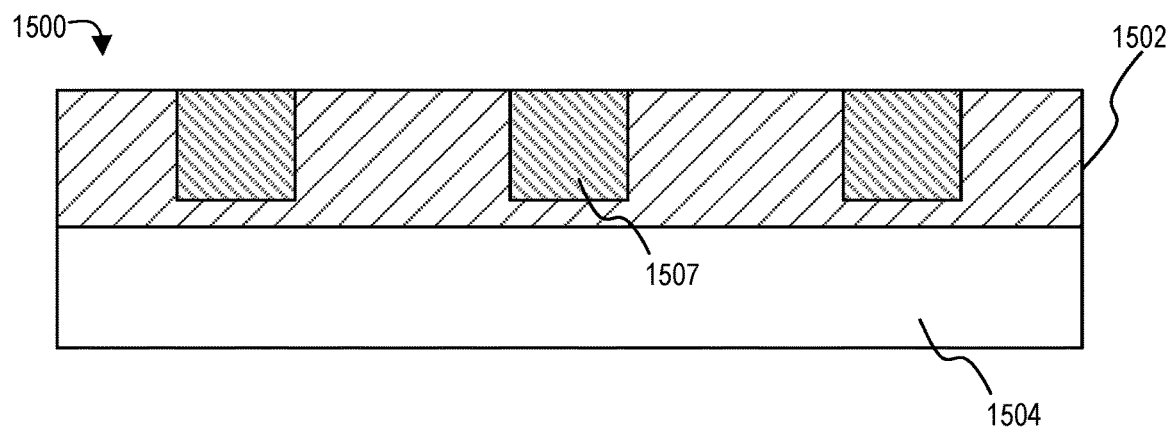
FIG. 16 is another portion of the fourth example process flow for low temperature hybrid bonding according to some implementations.

For further explanation, FIGS. 15-18 set forth an example process flow for preparing a die 1500 for hybrid bonding, such as the bottom die 102 depicted in FIG. 1, according to various implementations of the present disclosure. In the examples of FIGS. 15-16, notched bond pads 1508 are fabricated for receiving protruded bond pads of a mated die. The notched bond pads 1508 include a base portion and a notched portion. Beginning with FIG. 15, a dielectric layer 1502 is deposited on a die body 1504. In some implementations, the dielectric layer 1502 can be composed of silicon dioxide ($SO_2$) or other suitable insulating materials that will be recognized by those of skill in the art. The dielectric layer 1502 can be deposited using well-known deposition techniques. In some implementations, the die body 1504 includes additional metal and dielectric layers that form an interconnect layer of the die 300, as well as functional logic blocks composed of transistors and other circuitry. After forming the dielectric layer 1502, openings 1506 are created in the dielectric layer 1502. In some implementations, the openings 1506 are created through well-known masking and etching techniques.

Moving to FIG. 16, bond pad base portions 1507 are formed in the openings 1506 depicted in FIG. 4. In some implementations, the bond pad base portions 1507 are composed of copper, aluminum, gold, platinum, palladium, combinations of such, or other conductors. In some implementations, the bond pad base portions 1507 can be composed of highly (111)-oriented nanotwinned copper. The bond pad base portions 1507 can be formed using well-known masking, plating, CVD, PVD, or combinations of these techniques. In some examples, prior to forming the bond pad base portions 1507, a barrier layer is formed in the openings 1506 shown in FIG. 15. The barrier layer can be composed of $Ta_2O_5$, TaN, TiN, or other types of barrier layer materials suitable to prevent copper or other metals from diffusing out through the sidewalls of the openings 1506 shown in FIG. 15. Next, in circumstances where copper is used, a copper seed layer can be deposited in the openings 1506 and on the barrier layer, for example, by electroless plating. Then, a bulk plating process can be used to establish the bond pad base portions 1507.

Figure 17:
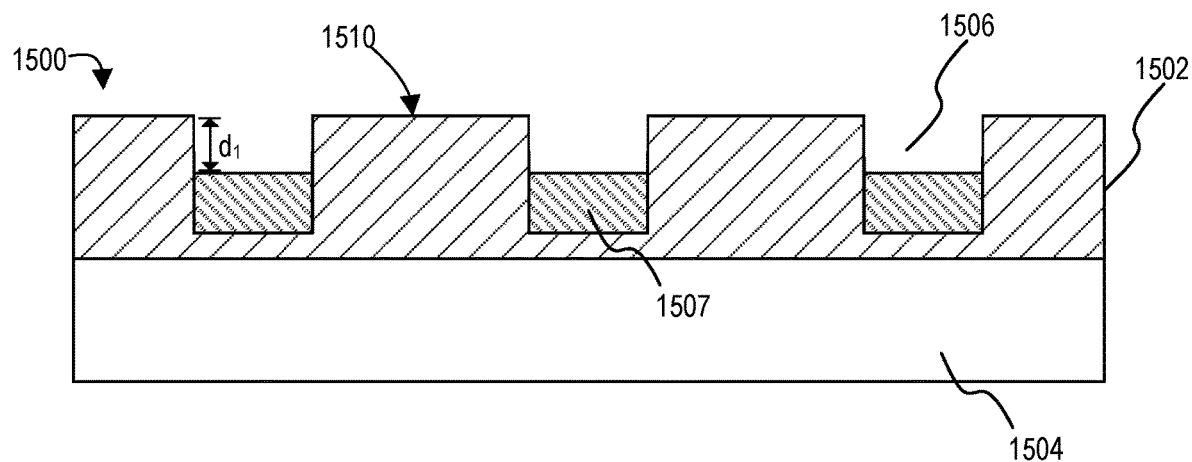
FIG. 17 is another portion of the fourth example process flow for low temperature hybrid bonding according to some implementations.

Moving to FIG. 17, the surface of the die 1500 that includes the surfaces of the dielectric layer 1502 and the bond pad base portions 1507 is planarized, for example, through a CMP process. As a result of the CMP process, in some examples the surfaces of the bond pad base portions 1507 recede from the bonding surface 1510 of the dielectric layer 1502. This result is sometimes referred to as dishing. As a consequence, a distance $d_1$ is created between the surface of the bond pad base portions 1507 and the bonding surface 1510 of the dielectric layer 1502. The distance $d_1$ can be, for example, on the order of 3-6 nanometers.

Figure 18:
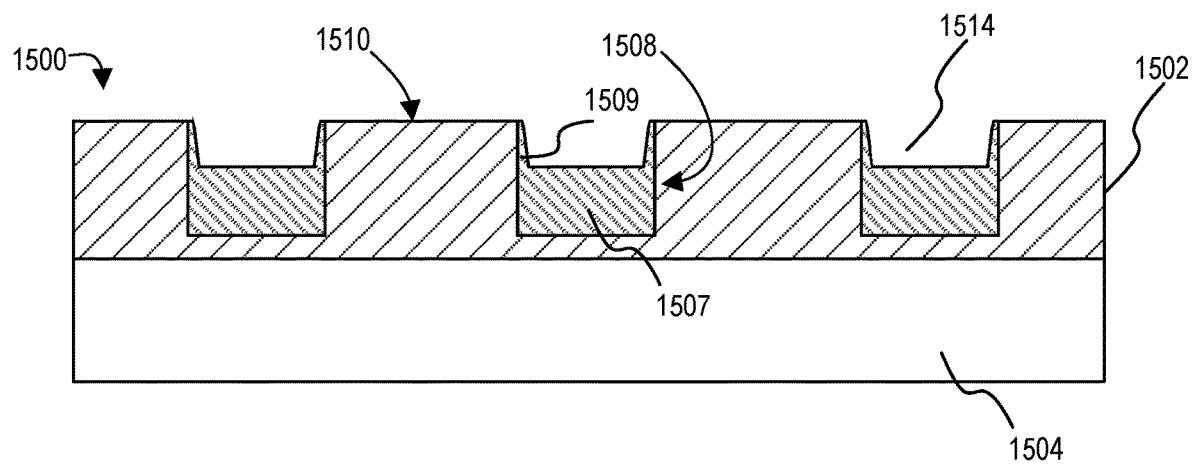
FIG. 18 is another portion of the fourth example process flow for low temperature hybrid bonding according to some implementations.

Moving to FIG. 18, an additional plating process is carried out within the openings 1506 of the dielectric layer 1502 to build up an annular bond structure 1509 on the bond pad base portions 1507. In some implementations, the annular bond structures 1509 are plated on the sidewall of the openings 1506 such that the bond pad base portions 1507 and annular bond structures 1509 form the notched bond pads 1508 having a notch 1514 formed therein. In some implementations, the distance between sidewalls of the annular bond structure 1509 decreases on approach to the surface of the bond pad base portions 1507, such that the notch 1514 is narrower at the bond pad base portion than at the bonding surface 1510 of the dielectric layer 1502. The annular bond structure can be composed of any of the conductors mentioned above. In some examples, the bonding surface 1510 is plasma treated to render it hydrophillic.

Figure 19:
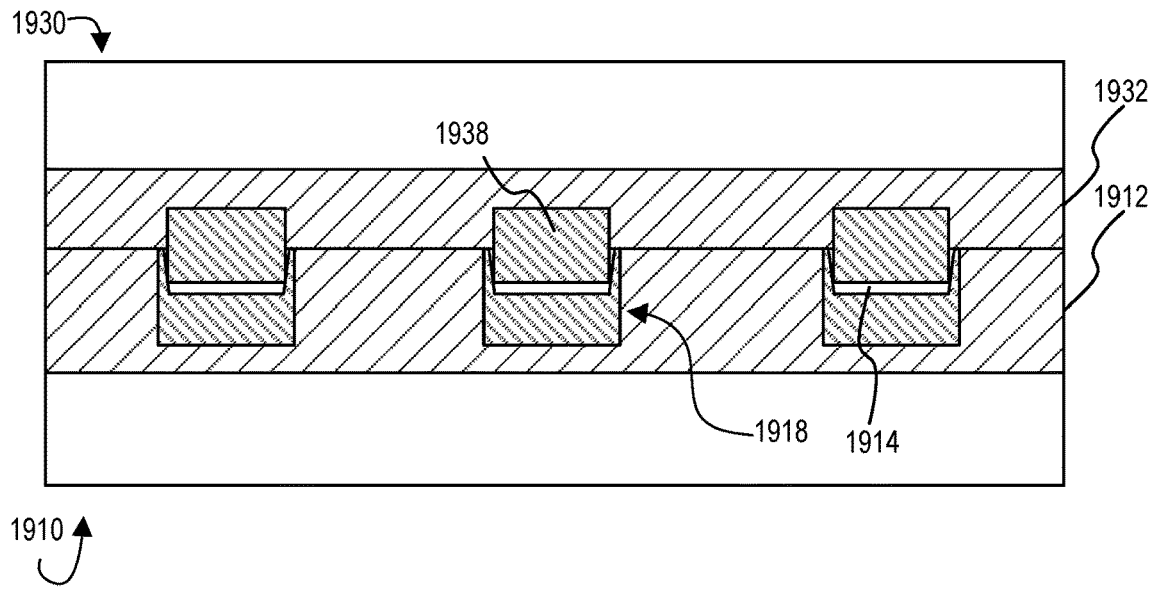
FIG. 19 is a portion of a fifth example process flow for low temperature hybrid bonding according to some implementations.
Figure 20:
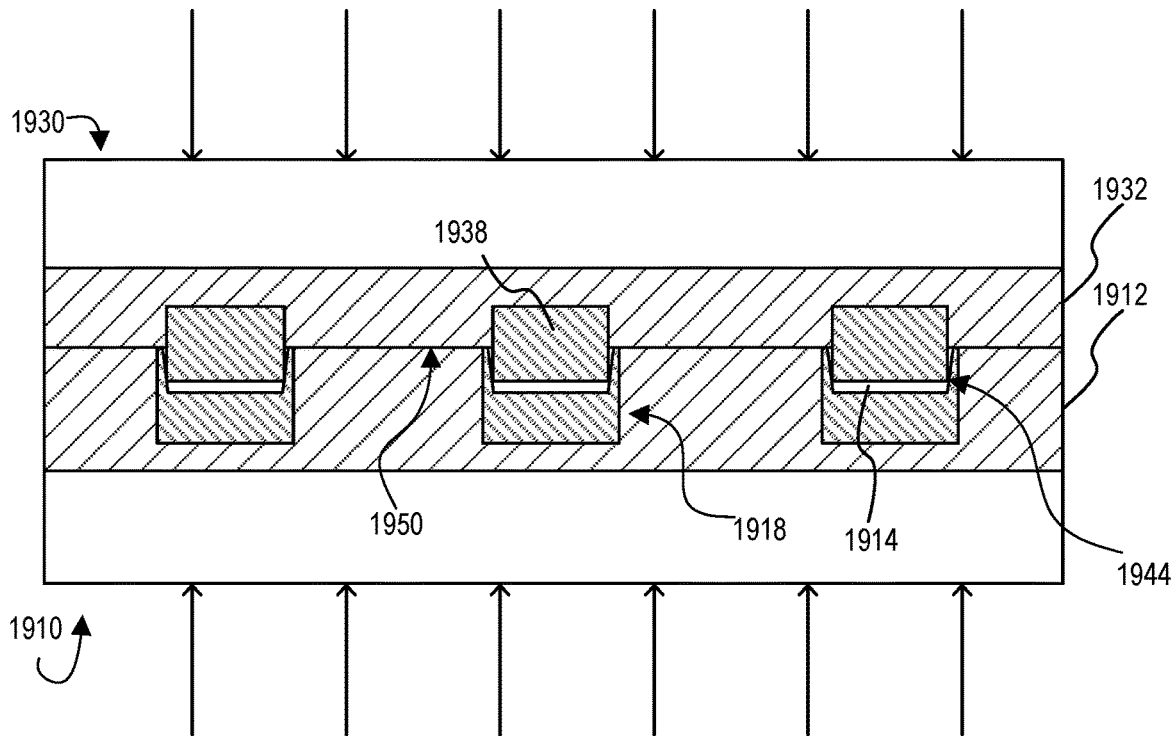
FIG. 20 is another portion of the fifth example process flow for low temperature hybrid bonding according to some implementations.
Figure 21:
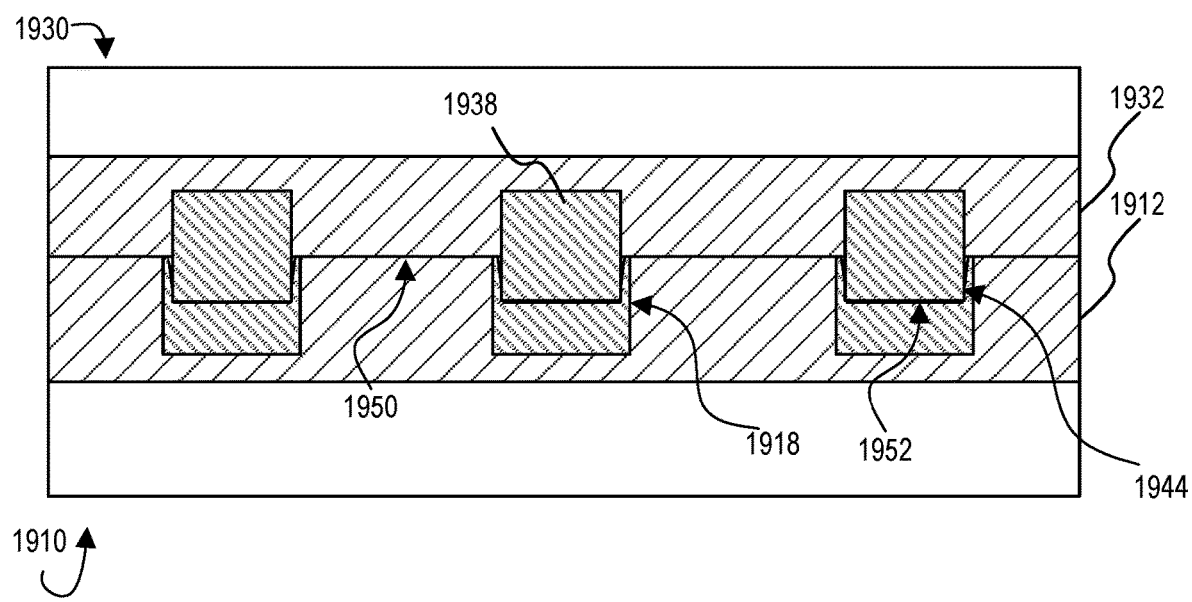
FIG. 21 is another portion of the fifth example process flow for low temperature hybrid bonding according to some implementations.

For further explanation, FIGS. 19-21 set forth an example process flow for a hybrid bonding of a die 1910 with notch bond pads 1918 and a die 1930 with protruded bond pads 1938 in accordance with some implementations of the present disclosure. In some examples, die 1910 is prepared as described with reference to FIGS. 15-18. In some examples, die 1930 is prepared as described with reference to FIGS. 3-5, and with the additional preparation described with reference to FIGS. 10-11, to create protruded bond pads 1938. Beginning with FIG. 19, die 1930 is placed on die 1910 such that the bond pads 1938 of die 1930 are in alignment with the bond pads 1918 of die 1910 and protrude into notches 1914 of the notched bond pads 1918.

Moving to FIG. 20, the dies 1910, 1930 undergo an anneal process at a temperature range of approximately 100° C. to 150° C. in which a dielectric bond interface 1950 is established between the dielectric layers 1912, 1932. During the anneal process, compression is applied to the dies 1910, 1930. As a result of the compression, localized heat at the contact points 1944 between the protruded bond pads 1938 and the notched bond pads 1918 allows a cold weld to establish. As shown in FIG. 21, the metal bond interface 1952 between the bond pads 1918, 1938 is not aligned with the dielectric bond interface 1950 between the dielectric layers 1912, 1932. In other words, the metal bond interface 1952 is offset from the dielectric bond interface 1950 along a y-axis.

Figure 22:
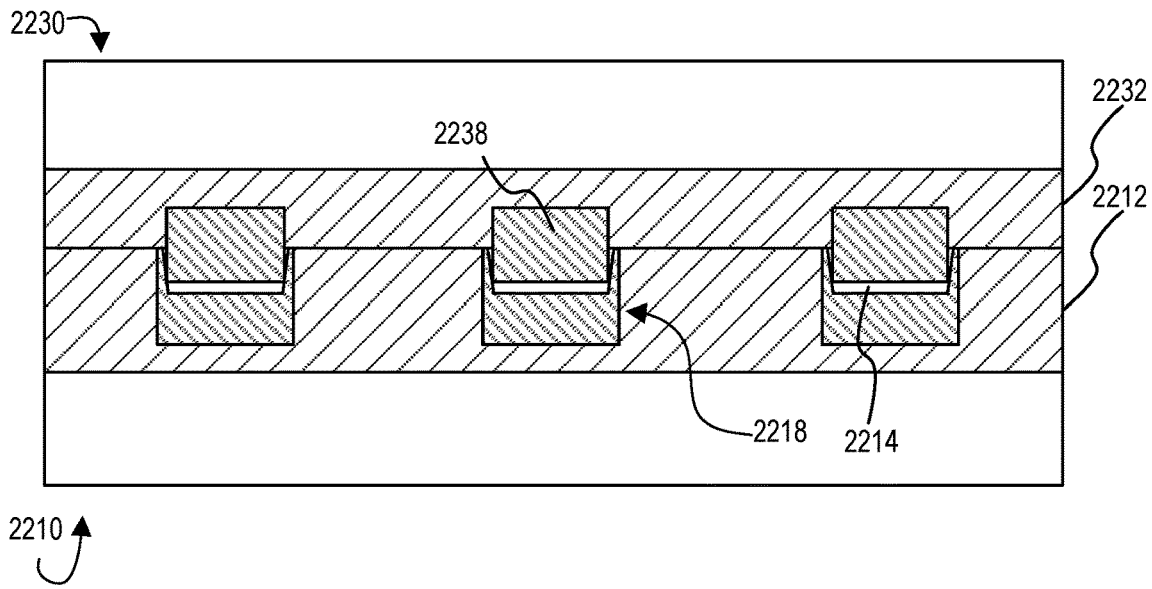
FIG. 22 is a portion of a sixth example process flow for low temperature hybrid bonding according to some implementations.
Figure 23:
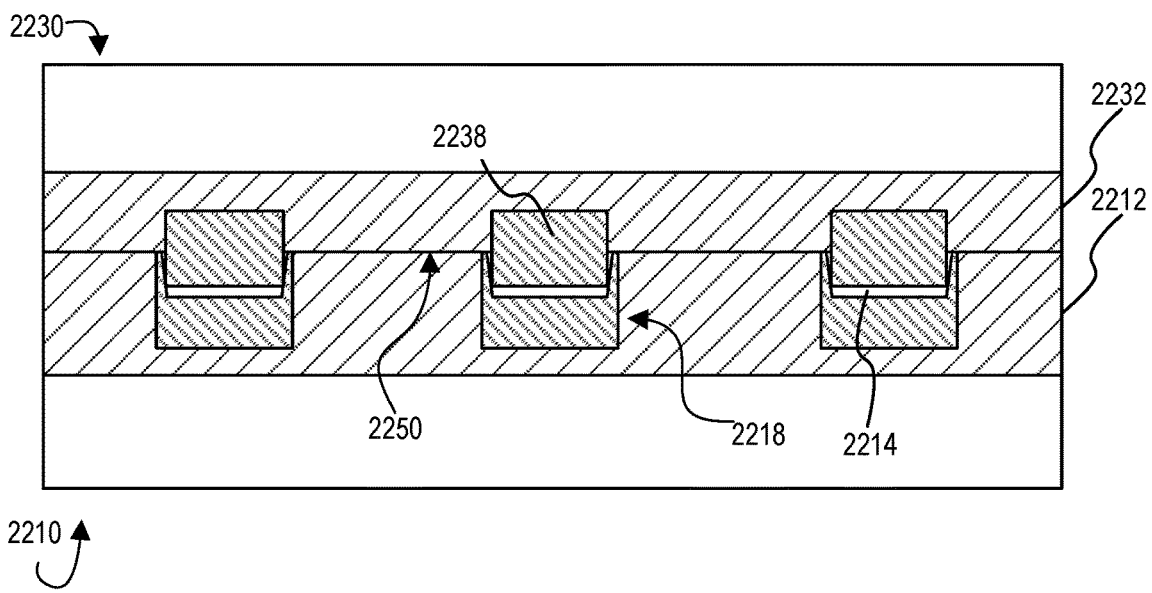
FIG. 23 is another portion of the sixth example process flow for low temperature hybrid bonding according to some implementations.
Figure 24:
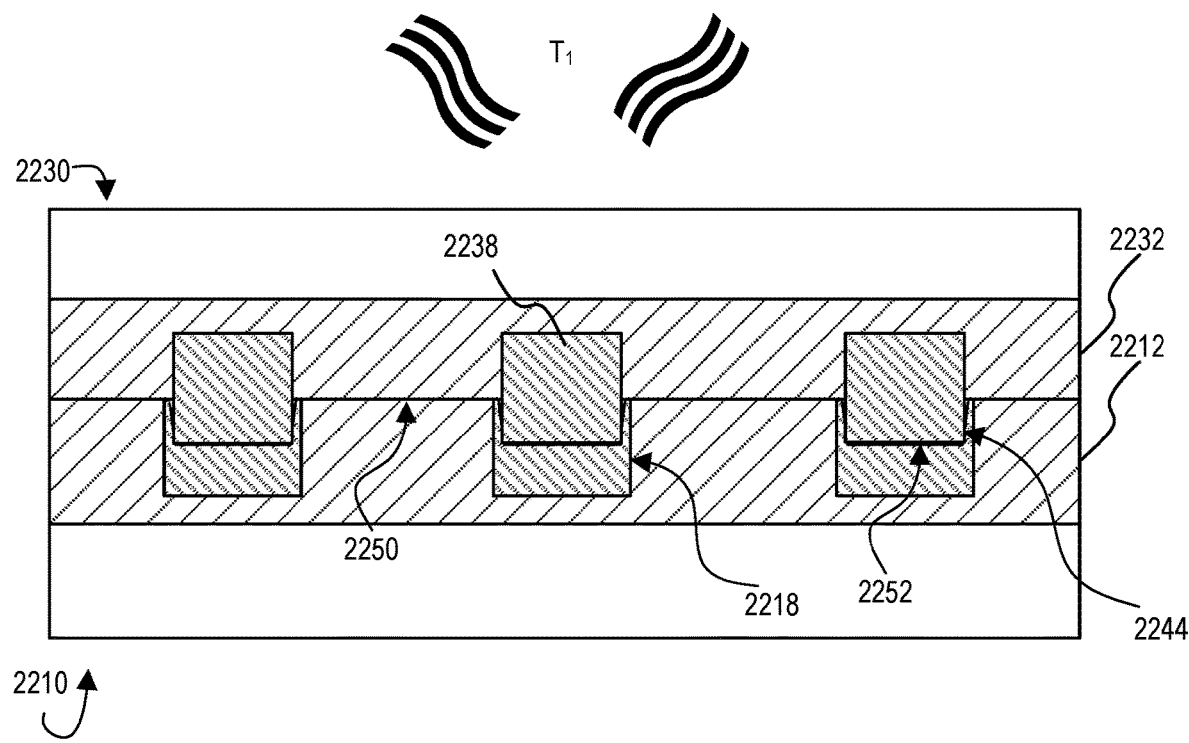
FIG. 24 is another portion of the sixth example process flow for low temperature hybrid bonding according to some implementations.

For further explanation, FIGS. 22-24 set forth an example process flow for a hybrid bonding of a die 2210 with notch bond pads 2218 and a die 2230 with protruded bond pads 2238 in accordance with some implementations of the present disclosure. In some examples, die 2210 is prepared as described with reference to FIGS. 15-18. In some examples, die 2230 is prepared as described with reference to FIGS. 3-5, and with the additional preparation described with reference to FIGS. 10-11, to create protruded bond pads 2238. Beginning with FIG. 22, die 2230 is stacked on die 2210 such that the bond pads 2238 of die 2230 are in alignment with the bond pads 2218 of die 2210 and protrude into notches 2214 of the notched bond pads 2218.

Moving to FIG. 23, the dies 2210, 2230 undergo an anneal process at a temperature range of approximately 100° C. to 150° C. in which a dielectric bond interface 2250 is established between the dielectric layers 2212, 2232. During the anneal process, no compression is applied to the dies 2210, 2230.

Moving to FIG. 24, the process temperature increases to a second temperature range $T_1$ during a second anneal process, where $T_1$ is less than 400° C. Within the temperature range $T_1$, the bond pads 2218, 2238 undergo plastic deformation and diffusion bonding, which results in a metal bond interface 2252 between the bond pads 2218, 2238 including a bond interface 2244 between a periphery of the bond pad 2238 and the annular portion of the bond pad 2218. As shown in FIG. 24, the metal bond interface 2252 between the bond pads 2218, 2238 is not aligned with the dielectric bond interface 2250 between the dielectric layers 2212, 2232. In other words, the metal bond interface 2252 is offset from the dielectric bond interface 2250 along a y-axis.

Figure 25:
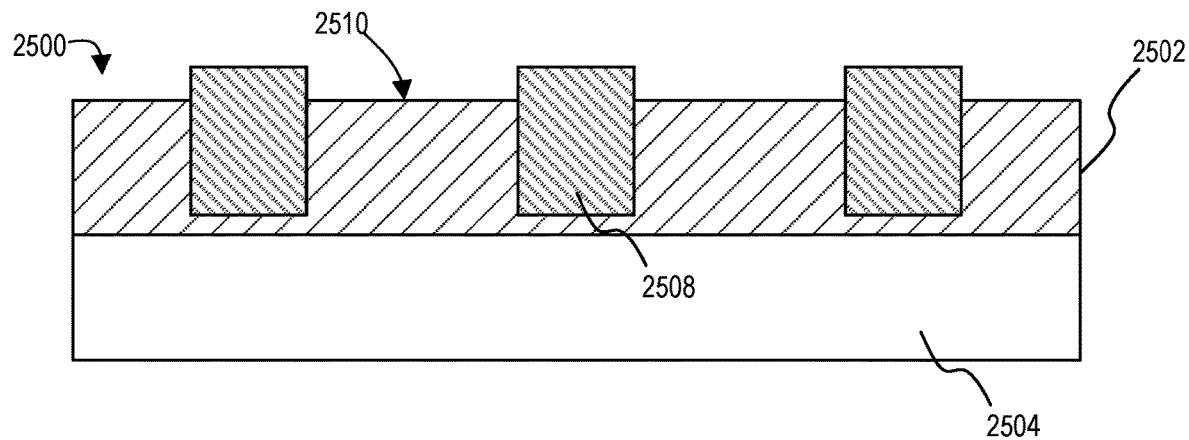
FIG. 25 is a portion of a seventh example process flow for low temperature hybrid bonding according to some implementations.
Figure 26:
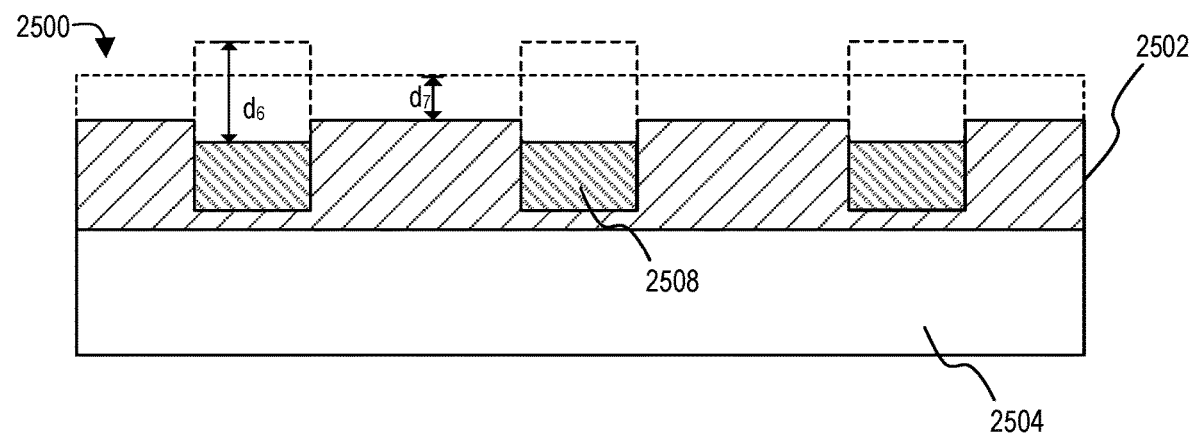
FIG. 26 is another portion of the seventh example process flow for low temperature hybrid bonding according to some implementations.

For further explanation, FIGS. 25-26 set forth an example process flow for preparing a die 2500 for hybrid bonding, such as the bottom die 102 or the top die 104 depicted in FIG. 1, according to various implementations of the present disclosure. Beginning with FIG. 25, in some implementations die 2500 is first prepared as described with reference to FIGS. 3-5 and with the additional preparation described with reference to FIGS. 10-11. That is, die 2500 includes a dielectric layer 2502 formed on a die body 2504 and further includes bond pads 2508 that protrude from a bonding surface 2510 of the dielectric layer 2502. The bonding surface 2510 is plasma treated to render it hydrophillic.

Moving to FIG. 26, the die 2500 is subjected to cooling from room temperature (e.g., 20° C.) to a temperature $T_3$ at which the bond pads 2508 contract such that the bond pads 2508 are below the level of the bonding surface 2510 of the dielectric layer 2502. At this temperature, the dielectric material of the dielectric layer 2502 and the metal of the bond pads 2508 contract. However, the metal of the bond pads 2508 contract more than the dielectric material in the dielectric layer 2502. In one example, the bond pads 2508 contract by a distance $d_6$ and the dielectric layer 2502 contracts by a distance $d_7$, where $d_6 > d_7$. In one example, $T_3$ is approximately −25° C. to −50° C. or colder.

Figure 29:
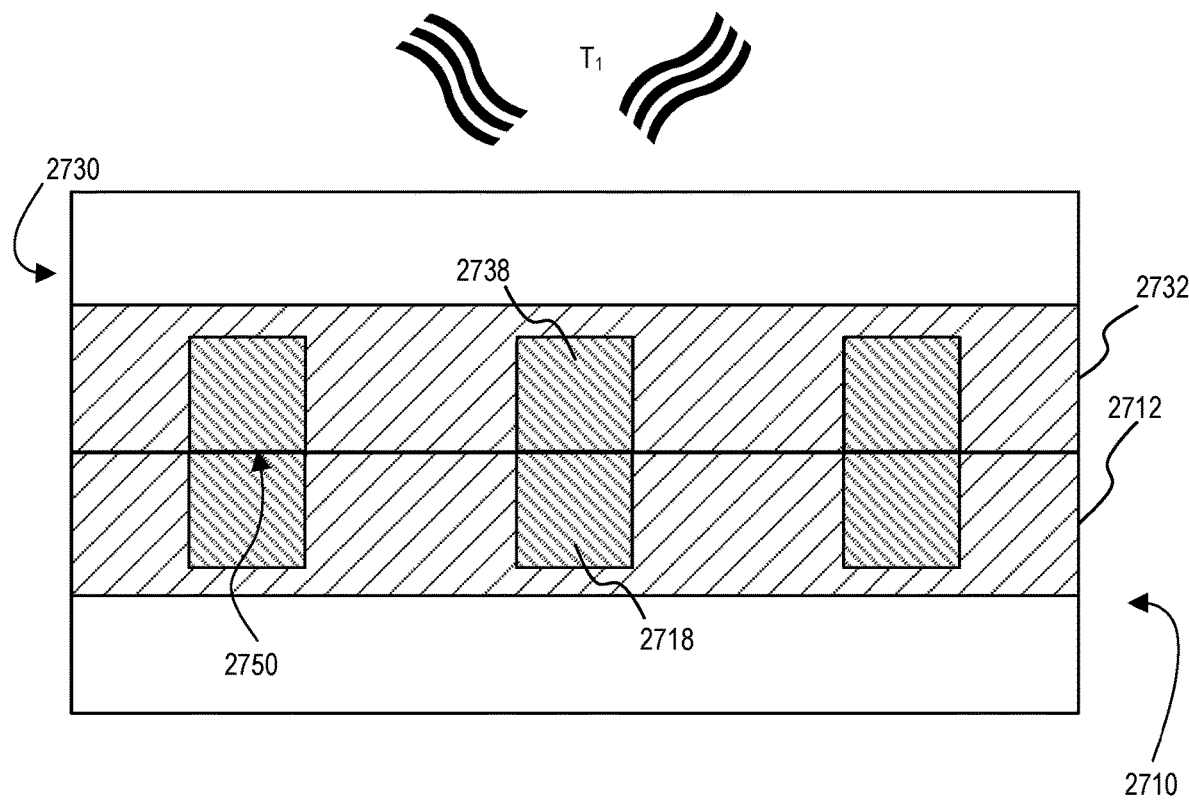
FIG. 29 is another portion of the eighth example process flow for low temperature hybrid bonding according to some implementations.

For further explanation, FIGS. 27-29 set forth an example process flow for a hybrid bonding of two cooled die 2710, 2730 in accordance with some implementations of the present disclosure. In some implementations, dies 2710, 2730 are both prepared as discussed with respect to FIGS. 25-26. Beginning with FIG. 27, cooled die 2730 is placed on cooled die 2710 such that the bond pads 2718 of die 2710 are in alignment with the bond pads 2738 of die 2730 and a hydrophilic bond is established between dielectric layers 2712, 2732 of the dies 2710, 2730. Here, the process temperature remains at subzero temperature $T_3$.

Moving to FIG. 28, the process temperature is increased causing thermal expansion of the dies 2710, 2730. At a temperature range $T_4$, the bond pads 2718, 2738 of each die 2710, 2730 have expanded to come into contact and diffusion bonding initiates. No annealing is required at this stage.

In one example, $T_4$ is less than the annealing process that forms a dielectric bond, or for example, less than 100° C. In further examples, $T_4$ is approximately 50-75° C. However, it should be recognized that temperature $T_4$ is driven by the initial cool down temperature $T_3$ and the initial cool down temperature $T_3$ can be adjusted to bring down the final hybrid bonding temperature $T_1$ within the compatibility limit of a given device.

Moving to FIG. 29, the dies 2710, 2730 undergo an anneal process at a temperature range $T_1$. Within the temperature range $T_1$, the bond pads 2718, 2738 undergo plastic deformation and diffusion bonding, which results in a metal bond interface 2750 between the bond pads 2718, 2738 that facilitates good electrical conductivity there between. In some examples, $T_1$ is less than 400° C. In further examples, $T_1$ is less than 300° C.

Figure 30:
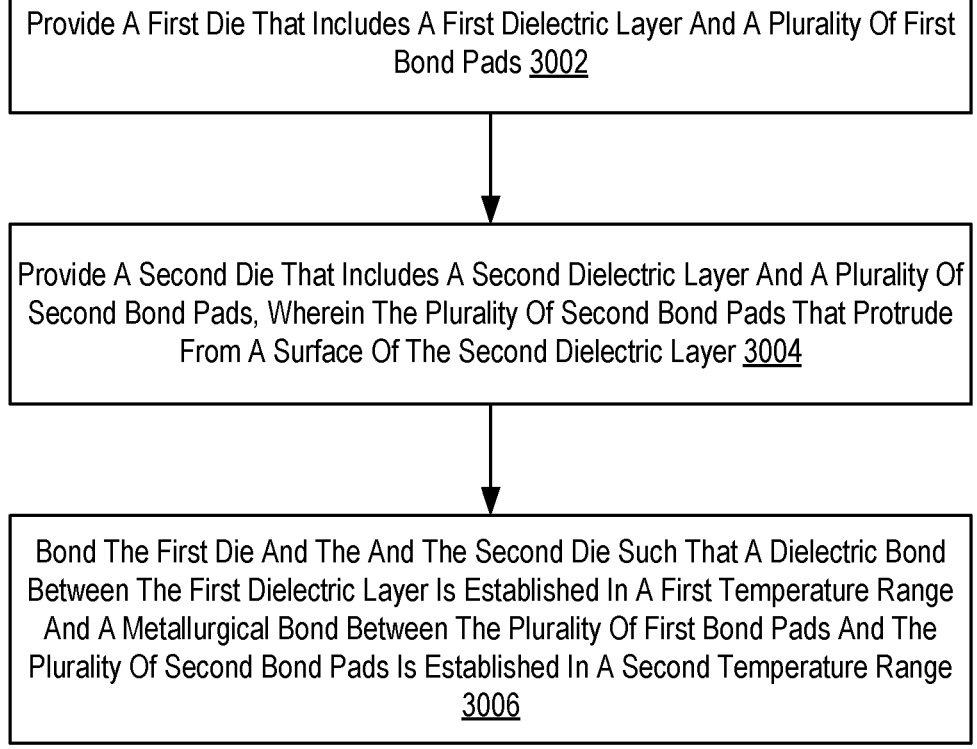
FIG. 30 is a flowchart of an example method of low temperature hybrid bonding according to some implementations.

For further explanation, FIG. 30 sets forth a flow chart illustrating an example method of low temperature hybrid bonding according to some implementations of the present disclosure. The example method of FIG. 30 includes providing 3002 a first die that includes a first dielectric layer and a plurality of first bond pads. In various examples, the bond pads of the first die can be recessed bond pads (i.e., recessed in the dielectric layer) or protruding bond pads (i.e., bond pads that protrude from a surface of the dielectric layer. In the former case, the first die can be prepared as described above with reference to FIGS. 3-5 in accordance with some implementations. In the latter case, the first die can be prepared as described above with reference to FIGS. 10-11 in accordance with some implementations.

The example method of FIG. 30 also includes providing 3004 a second die that includes a second dielectric layer and a plurality of second bond pads, wherein the plurality of second bond pads that protrude from a surface of the second dielectric layer. In some implementations, the second die is prepared as described above with reference to FIGS. 10-11.

The example method of FIG. 30 also includes bonding 3006 the first die and the second die such that a dielectric bond between the first dielectric layer is established in a first temperature range and a metallurgical bond between the plurality of first bond pads and the plurality of second bond pads is established in a second temperature range. In some implementations, where the first die includes recessed bond pads and the second die includes protruded bond pads, bonding 3006 the first die and the second die is carried out as described above with reference to FIGS. 12-14. In other implementations, where the first die includes notched bond pads and the second die includes protruded bond pads, bonding 3006 the first die and the second die is carried out as described above with reference to FIGS. 19-21 or with reference to FIGS. 22-24. In still further implementations, where the first die and the second die both include protruded bond pads prior to bonding, bonding 3006 the first die and the second die is carried out as described above with reference to FIGS. 27-29.

For further explanation, FIG. 31 sets forth a flow chart illustrating another example method of low temperature hybrid bonding according to some implementations of the present disclosure. The example method of FIG. 31 includes aspects of the method in FIG. 30 and further includes establishing 3102 the metallurgical bond in a first plane and establishing the dielectric bond in a second plane, wherein the first plane is offset from the second plane in a direction perpendicular to the dielectric bond interface. In some implementations where the first die includes recessed bond pads or notched bond pads and the second die includes protruded bond pads, the bond pads of the second die protrude into the recesses of the dielectric layer of the first die when the first die and the second die are mated for bonding. This reduces the distance between the bond pads of the first die and the second die when compared to the technique described with reference to FIGS. 6-9. This also means that the interfaces between the bond pads of the first die and the second die are not aligned with the interface between the dielectric layers of the first die and the second die. The interfacing between the bond pads of the first die and the second die occurs within the opening in the dielectric layer of the first die in which the bond pads of the first die are seated. Further, because of the reduced distance between the bond pads when hybrid bonding is initiated, the required thermal expansion needed for the bond pads to interface is less, and thus the temperature needed for plastic deformation and metallurgical bonding is also less. In various implementations, establishing 3102 the metallurgical bond in a first plane and establishing the dielectric bond in a second plane is carried out as described above with reference to FIGS. 12-14, with reference to FIG. 21-23, or with reference to FIGS. 24-26.

Figure 32:
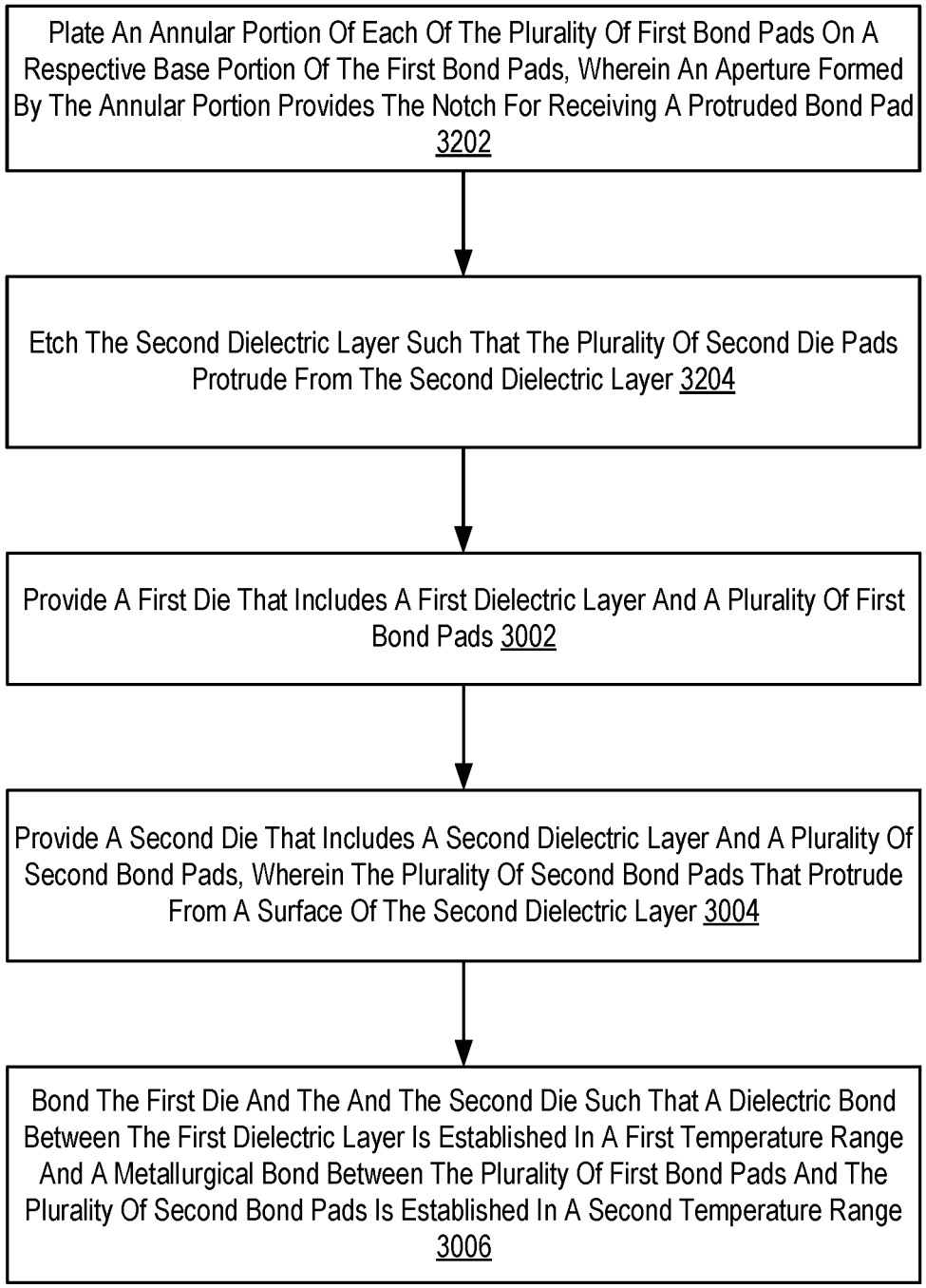
FIG. 32 is a flowchart of another example method of low temperature hybrid bonding according to some implementations.

For further explanation, FIG. 32 sets forth a flow chart illustrating another example method of low temperature hybrid bonding according to some implementations of the present disclosure. The example method of FIG. 32 includes aspects of the method in FIG. 30 and further includes plating 3202 an annular portion of each of the plurality of first bond pads on a respective base portion of the first bond pads, wherein an aperture formed by the annular portion provides the notch for receiving a protruded bond pad. In some implementations, the first die having a notched bond pad is fabricated as describe above with reference to FIGS. 15-18.

The example method of FIG. 32 also includes etching 3204 the second dielectric layer such that the plurality of second bond pads protrude from the second dielectric layer. In some implementations, the second die having protruded bond pads is prepared by etching the dielectric layer as described above with reference to FIGS. 3-5 and 10-11.

Figure 33:
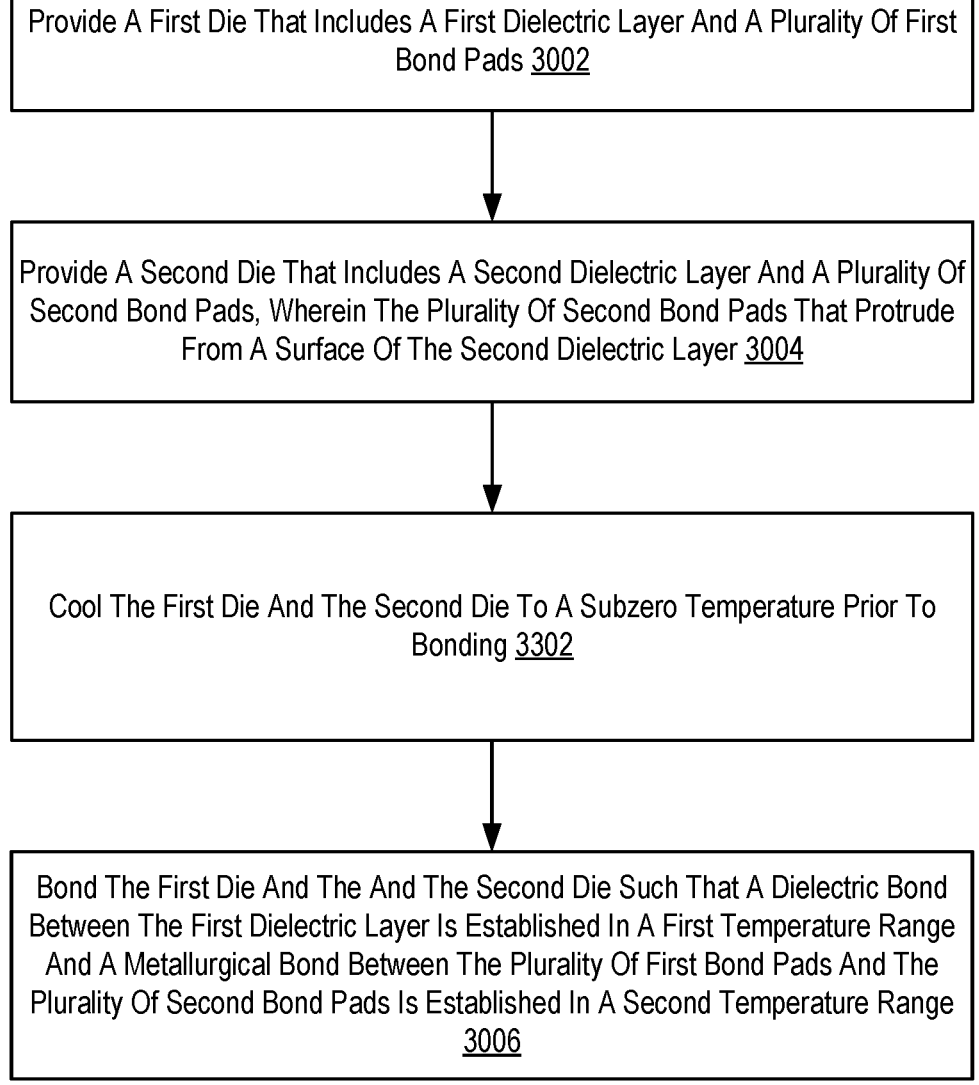
FIG. 33 is a flowchart of another example method of low temperature hybrid bonding according to some implementations.

For further explanation, FIG. 33 sets forth a flow chart illustrating another example method of low temperature hybrid bonding according to some implementations of the present disclosure. The example method of FIG. 33 includes aspects of the method in FIG. 30 and further includes cooling 3302 the first die and the second die to a subzero temperature prior to bonding. In some implementations, the first die and the second die are both prepared to include bond pads that protrude from their respective dielectric layers. In these implementations, prior to bonding, the first die and the second die are cooled to a subzero temperature. For example, the first die and the second die can be cooled to −50 to −75° C. This causes the dielectric material in the dielectric layers and the metal in the bond pads to contract. However, the metal in the bond pads contracts more than the dielectric material in the dielectric layers. When the first die and the second die are mated, the dies are heated causing thermal expansion of the bond pads. By the time the process temperature reaches 100° C., the bond pads of the first and second die will have interfaced and diffusion bonding will have initiated. An annealing process at a higher temperature, which is still a relatively low temperature (less than 400° C.), establishes the metallurgical bond between the bond pads of the first die and the bond pads of the second die. In some implementations, cooling 3302 the first die and the second die to a subzero temperature prior to bonding 3006 the first die and the second die is carried out as described above with reference to FIGS. 25-28.

In view of the foregoing, it will be recognized that implementations in accordance with the present disclosure provide bond pad arrangements and process flows for low temperature hybrid bonding. In some implementations, a reduction in the distance between counterpart bond pads at the outset of bonding reduces the temperature at which a metallurgical bond can be established when compared to conventional techniques. In other implementations, dies are cooled to subzero temperature prior to bonding such that the interface established between bond pads due to thermal expansion occurs at a lower temperature, thus resulting in a metallurgical bond at lower temperatures when compared to conventional techniques. By completing a hybrid bond at a lower temperature, the hybrid bonding process can be extended to temperature sensitive applications.

It will be understood from the foregoing description that modifications and changes can be made in various implementations of the present disclosure. The descriptions in this specification are for purposes of illustration only and are not to be construed in a limiting sense. The scope of the present disclosure is limited only by the language of the following claims.

What is claimed is:

1. A semiconductor device comprising:
    a first die, the first die including:
        a first dielectric layer; and
        a plurality of first bond pads formed within apertures in the first dielectric layer, wherein each of the first bond pads includes a base portion and an annular portion plated on the base portion; and
    a second die bonded to the first die, the second die including:
        a second dielectric layer; and
        a plurality of second bond pads protruding from the second dielectric layer, wherein the first die is bonded to the second die such that the plurality of second bond pads protrude into the apertures in the first dielectric layer to establish respective metallurgical bonds with the plurality of first bond pads.

2. The semiconductor device of claim 1, wherein a hybrid bond of the first die and the second die includes the metallurgical bonds between the plurality of first bond pads and the plurality of second bond pads and a dielectric bond between the first dielectric layer and the second dielectric layer.

3. The semiconductor device of claim 2, wherein an interface of at least one metallurgical bond is unaligned with an interface of the dielectric bond.

4. The semiconductor device of claim 1, wherein each of the plurality of first bond pads includes a notch; and wherein the plurality of second bond pads mate with the notches of the plurality of first bond pads.

5. The semiconductor device of claim 4, wherein the metallurgical bond is a cold weld.

6. The semiconductor device of claim 1, wherein, prior to bonding, a first distance between the plurality of first bond pads and a surface of the first dielectric layer is greater than a second distance by which the plurality of second bond pads protrude from the second dielectric layer.

7. The semiconductor device of claim 6, wherein a difference between the first distance and the second distance is 1-2 nanometers.

8. The semiconductor device of claim 2, wherein the metallurgical bonds are in a first plane and the dielectric bond is in a second plane, the second plane being offset from the first plane in a direction perpendicular to an interface of the dielectric bond.

9. The semiconductor device of claim 1, wherein the plurality of first bond pads of the first die is at least partially recessed from a surface of the first dielectric layer.

10. The semiconductor device of claim 1, wherein the plurality of first bond pads of the first die protrude from a surface of the first dielectric layer.

11. An apparatus comprising:
    a carrier including a plurality of interconnects for mounting to a component;
    a first die coupled to the carrier, the first die including:
        a first dielectric layer; and
        a plurality of first bond pads formed within apertures in the first dielectric layer, wherein each of the first bond pads includes a base portion and an annular portion plated on the base portion; and
    a second die bonded to the first die, the second die including:
        a second dielectric layer; and
        a plurality of second bond pads protruding from the second dielectric layer, wherein the first die is bonded to the second die such that the plurality of second bond pads protrude into the apertures in the first dielectric layer to establish respective metallurgical bonds with the plurality of first bond pads.

12. The apparatus of claim 11, wherein a hybrid bond of the first die and the second die includes the metallurgical bonds between the plurality of first bond pads and the plurality of second bond pads and a dielectric bond between the first dielectric layer and the second dielectric layer.

13. The apparatus of claim 12, wherein an interface of at least one metallurgical bond is unaligned with an interface of the dielectric bond.

14. The apparatus of claim 11, wherein each of the plurality of first bond pads includes a notch; and wherein the plurality of second bond pads mate with the notches of the plurality of first bond pads.

15. The apparatus of claim 14, wherein the metallurgical bond is a cold weld.

16. The apparatus of claim 11, wherein, prior to bonding, a first distance between the plurality of first bond pads and a surface of the first dielectric layer is greater than a second distance by which the plurality of second bond pads protrude from the second dielectric layer.

17. The apparatus of claim 12, wherein the metallurgical bonds are in a first plane and the dielectric bond is in a second plane, the second plane being offset from the first plane in a direction perpendicular to an interface of the dielectric bond.

18. The apparatus of claim 11, wherein the plurality of first bond pads of the first die is at least partially recessed from a surface of the first dielectric layer.

19. The apparatus of claim 11, wherein the plurality of first bond pads of the first die protrude from a surface of the first dielectric layer.

20. The apparatus of claim 11, wherein the first die includes one or more through-silicon vias coupled to the interconnects of the carrier.

* * * * *